(12) United States Patent
Milani et al.

(10) Patent No.: US 11,867,509 B2
(45) Date of Patent: Jan. 9, 2024

(54) ROBUST METHOD FOR GYROSCOPE DRIVE AMPLITUDE MEASUREMENT

(71) Applicant: INVENSENSE, INC., San Jose, CA (US)

(72) Inventors: Damiano Milani, Fontanella (IT); Luca Coronato, Corsico (IT)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 17/679,497

(22) Filed: Feb. 24, 2022

(65) Prior Publication Data

US 2022/0282973 A1 Sep. 8, 2022

Related U.S. Application Data

(60) Provisional application No. 63/155,867, filed on Mar. 3, 2021.

(51) Int. Cl.
| | |
|---|---|
| *G01C 19/5762* | (2012.01) |
| *G01C 19/5712* | (2012.01) |
| *B81B 3/00* | (2006.01) |
| *G01C 19/5733* | (2012.01) |
| *G01C 19/5769* | (2012.01) |
| *G01C 19/5726* | (2012.01) |

(52) U.S. Cl.
CPC ........ *G01C 19/5762* (2013.01); *B81B 3/0021* (2013.01); *G01C 19/5712* (2013.01); *G01C 19/5726* (2013.01); *G01C 19/5733* (2013.01); *G01C 19/5769* (2013.01); *B81B 2201/0242* (2013.01); *B81B 2203/0163* (2013.01); *B81B 2203/04* (2013.01); *B81B 2207/012* (2013.01)

(58) Field of Classification Search
CPC ............ G01C 19/5762; G01C 19/5712; G01C 19/5733; G01C 19/5769; G01C 19/5726; B81B 3/0021
See application file for complete search history.

(56) References Cited

U.S. PATENT DOCUMENTS

| | | | | |
|---|---|---|---|---|
| 5,900,549 | A * | 5/1999 | Moriya | ............ G01C 19/5719 73/504.12 |
| 2005/0274181 | A1* | 12/2005 | Kutsuna | ............ G01C 19/5719 73/504.12 |
| 2014/0152325 | A1* | 6/2014 | Narita | .................. B81B 3/0086 324/662 |
| 2017/0168088 | A1* | 6/2017 | Coronato | ............. G01P 15/125 |
| 2018/0038692 | A1* | 2/2018 | Prati | .................... G01C 19/574 |
| 2018/0216935 | A1* | 8/2018 | Senkal | ............... G01C 19/5762 |

(Continued)

FOREIGN PATENT DOCUMENTS

| | | |
|---|---|---|
| CN | 110389530 A | 10/2019 |
| CN | 110456639 A | 11/2019 |

(Continued)

*Primary Examiner* — Helen C Kwok
(74) *Attorney, Agent, or Firm* — Van Hoven PC; Joshua Van Hoven

(57) ABSTRACT

A MEMS gyroscope includes a driven mass that moves in response to a drive force. A drive amplitude sense electrode is included as a feature of the drive mass and extends in a direction perpendicular to the drive direction. A change in capacitance is measured based on the relative location of the drive amplitude sense electrode to a known fixed position, which in turn is used to accurately determine a location of the driven mass.

21 Claims, 18 Drawing Sheets

(56) References Cited

U.S. PATENT DOCUMENTS

2019/0178645 A1* 6/2019 Senkal ............... G01C 19/5712
2020/0400434 A1* 12/2020 Guerinoni ............. B81B 3/0018
2021/0144487 A1 5/2021 Watson et al.
2021/0292157 A1 9/2021 Chang et al.

FOREIGN PATENT DOCUMENTS

| CN | 110508204 A | 11/2019 |
|---|---|---|
| CN | 112597834 A | 4/2021 |
| CN | 114326005 A | 4/2022 |
| EP | 3982082 A1 | 4/2022 |
| WO | 2019/032179 A1 | 2/2019 |
| WO | 2020/003246 A1 | 1/2020 |
| WO | 2022/073707 A1 | 4/2022 |

* cited by examiner

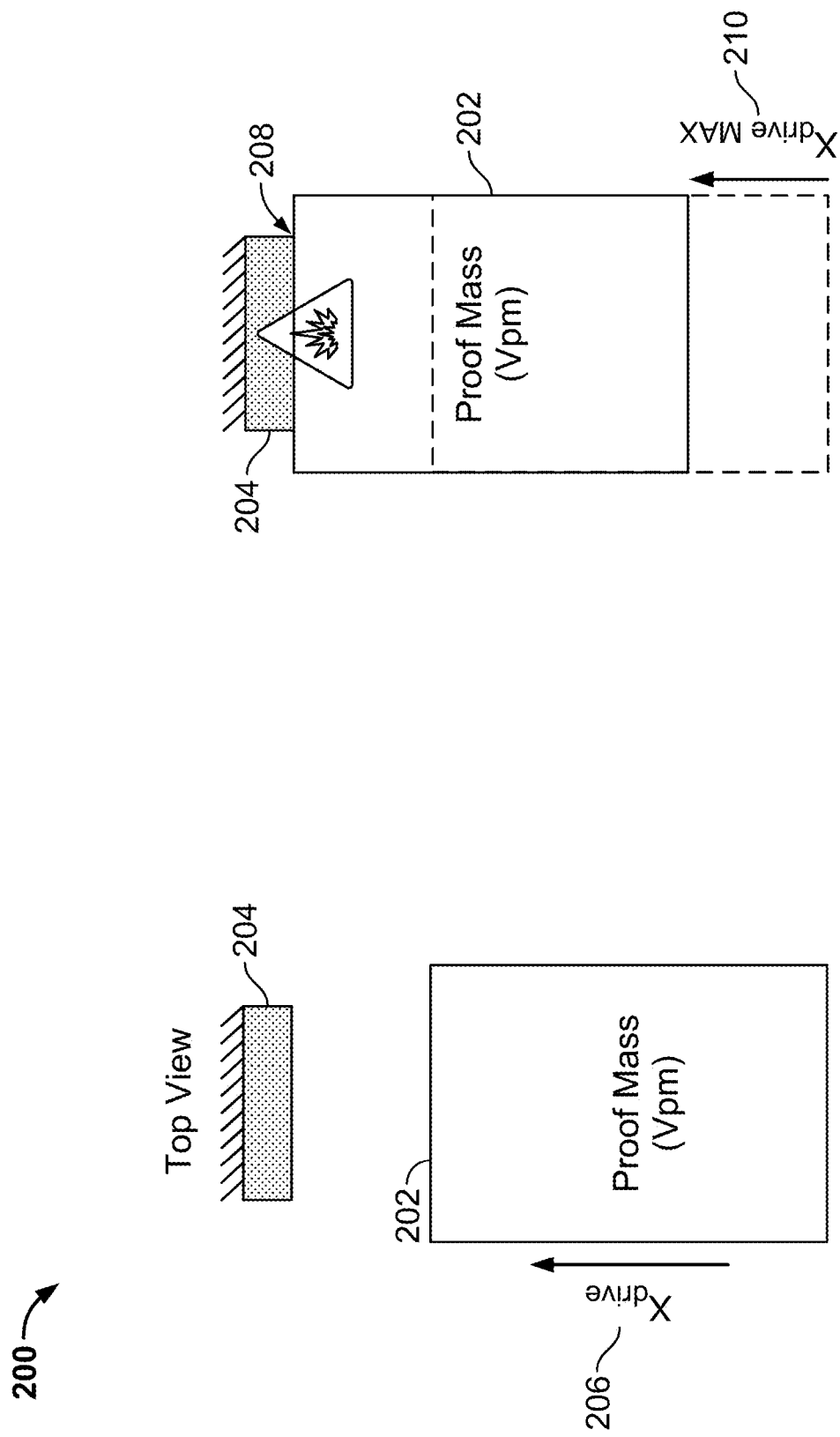

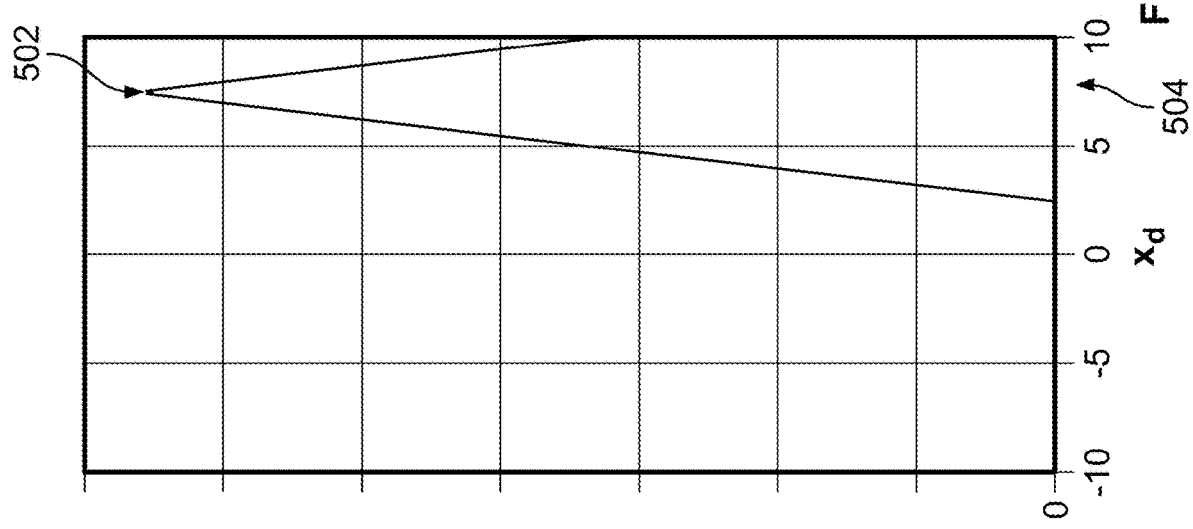
FIG. 5C
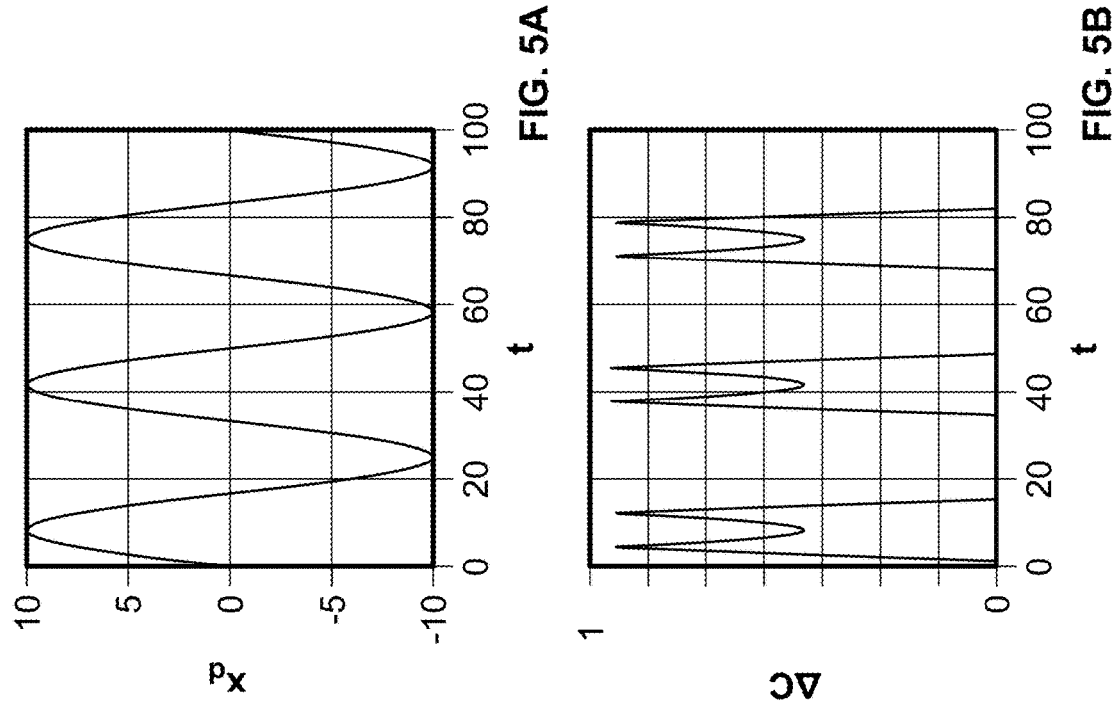
FIG. 5A
FIG. 5B

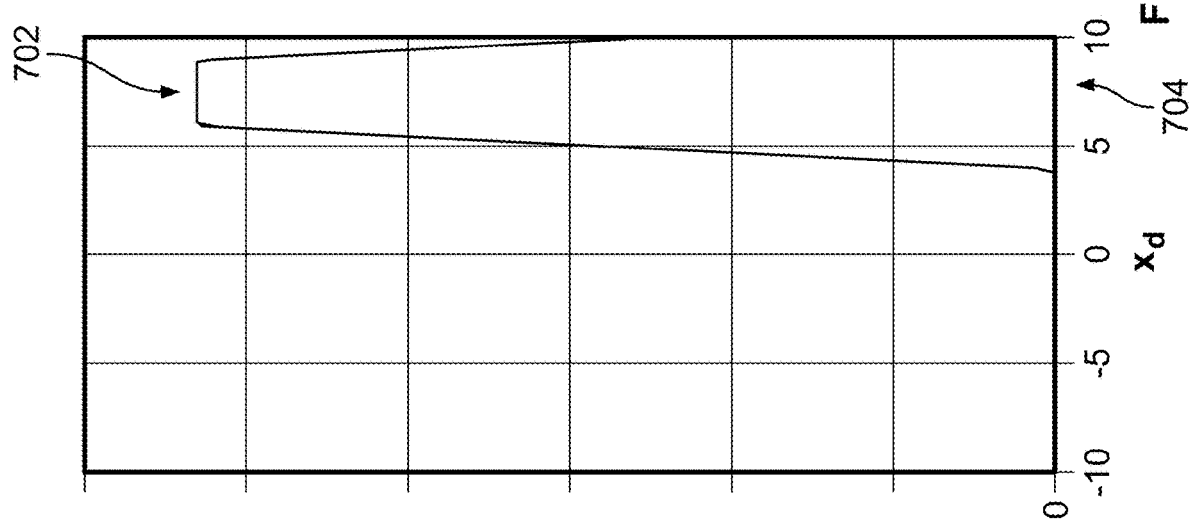
FIG. 7C
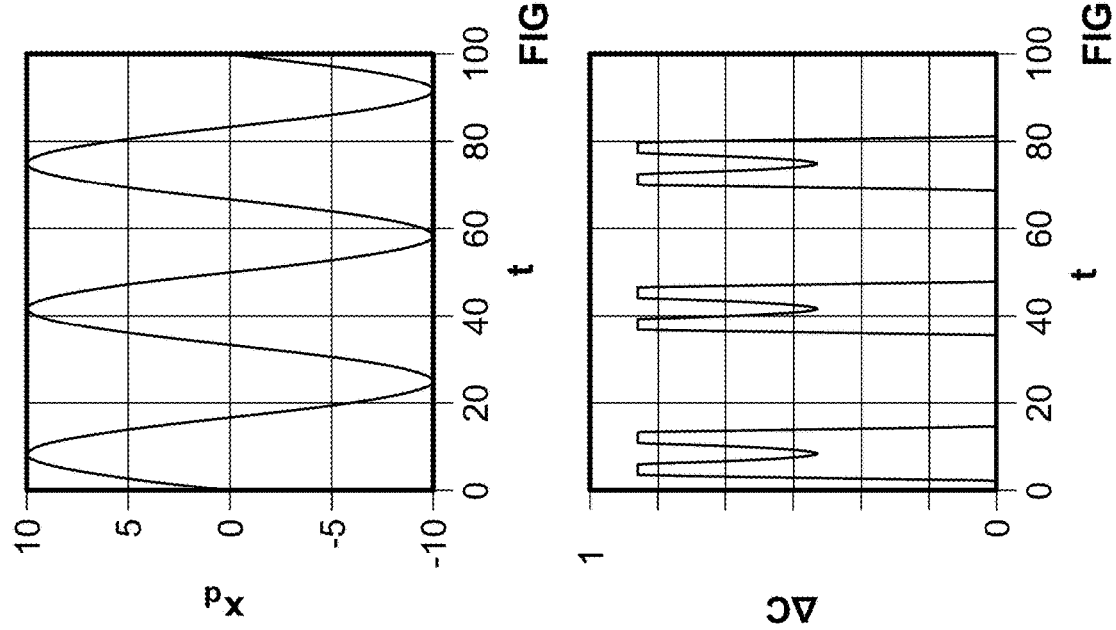
FIG. 7A
FIG. 7B

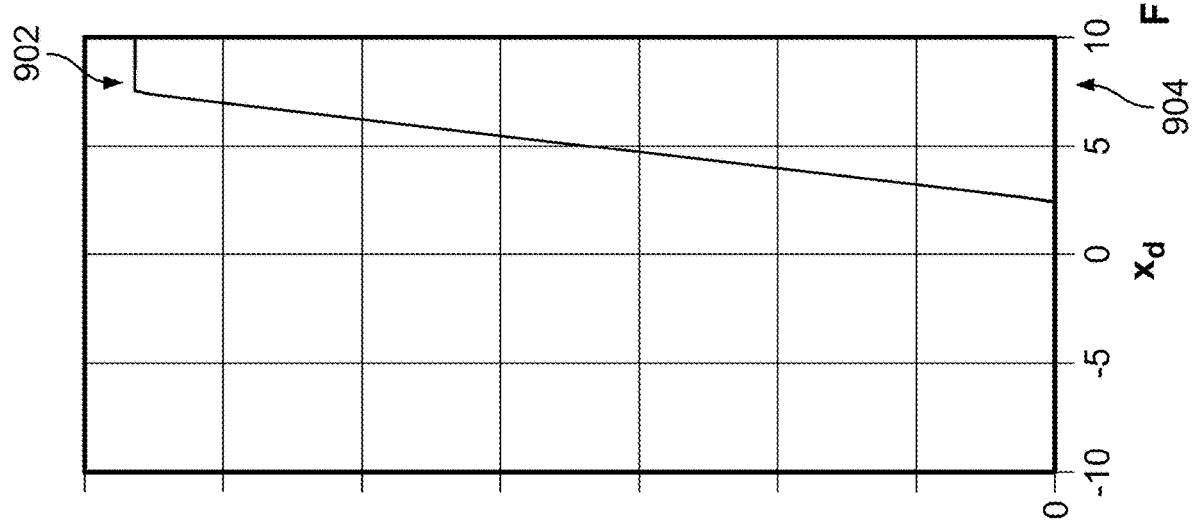
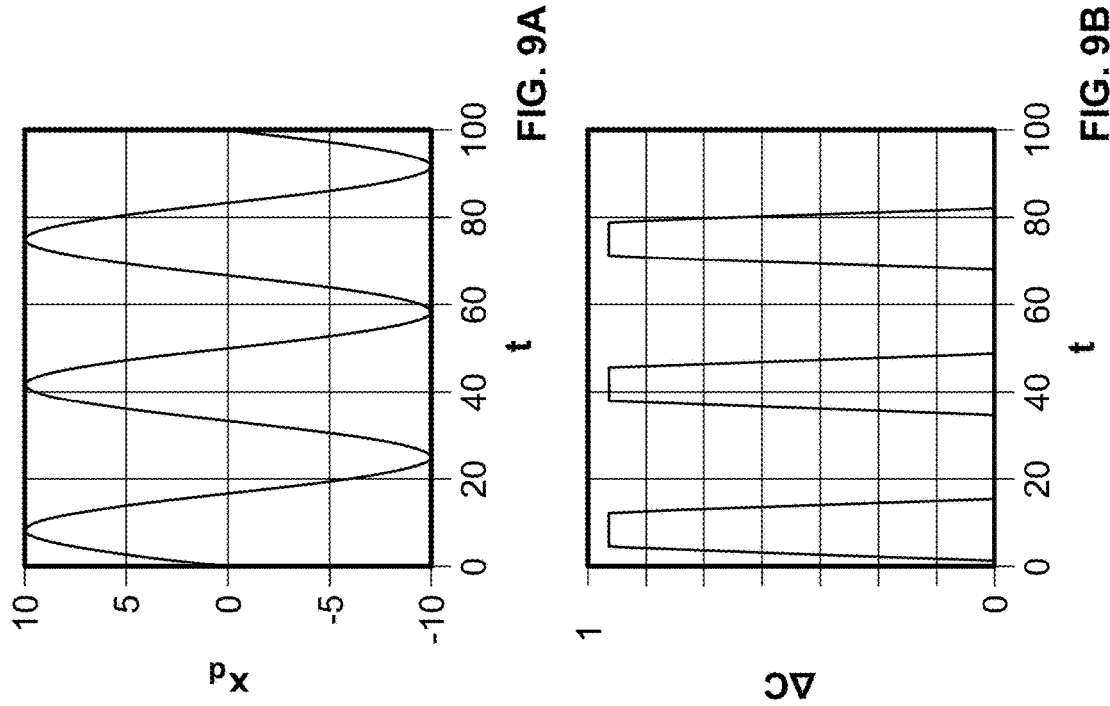

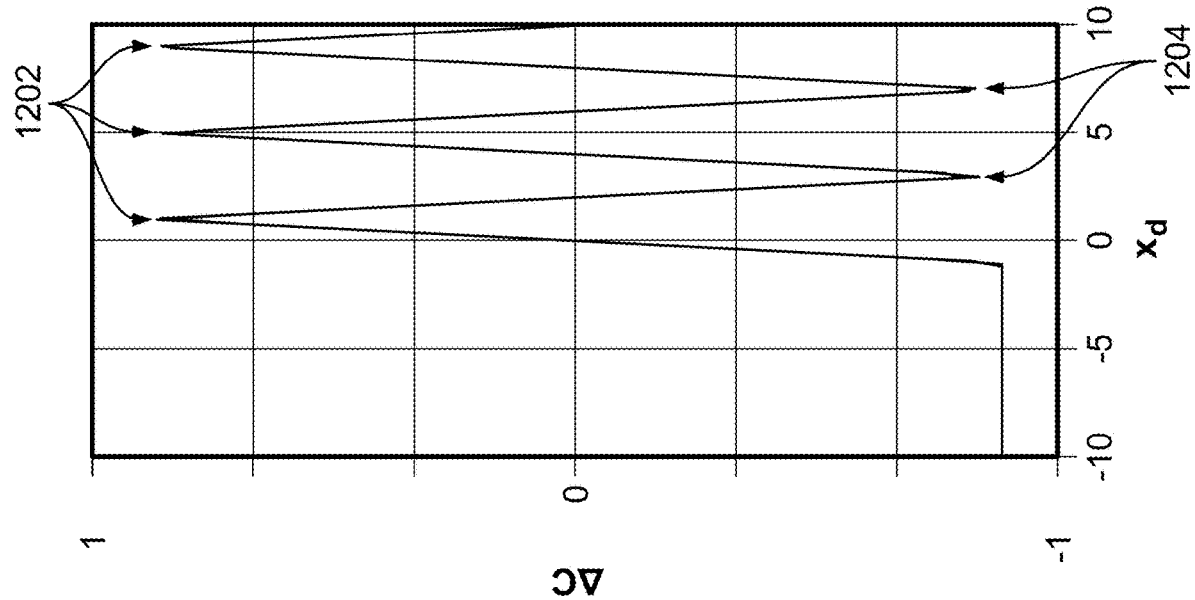
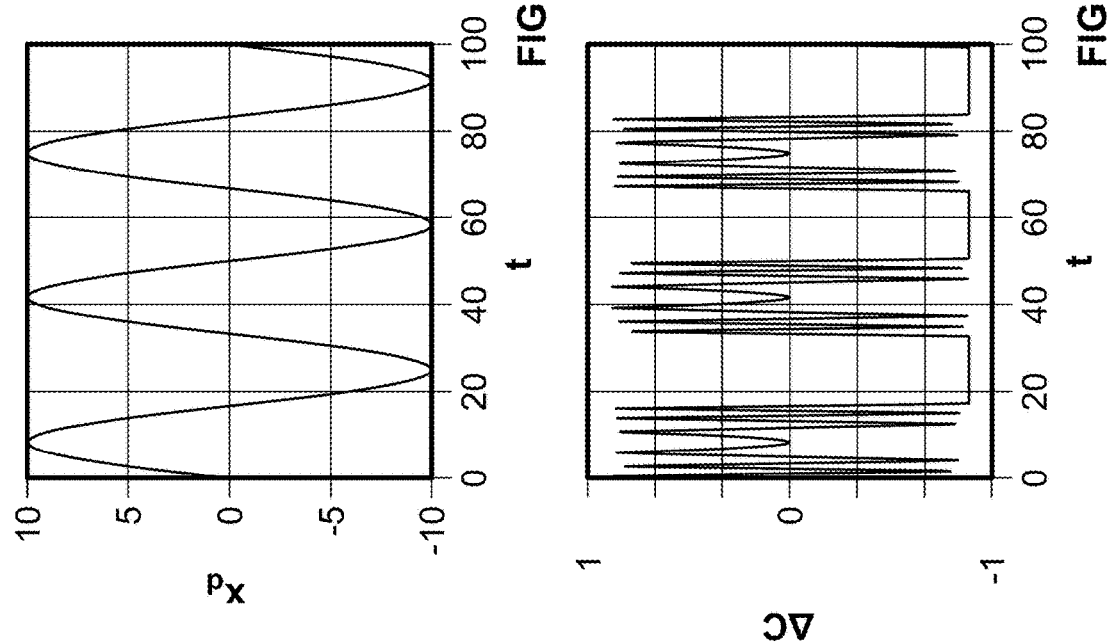

ROBUST METHOD FOR GYROSCOPE DRIVE AMPLITUDE MEASUREMENT

CROSS REFERENCE TO RELATED APPLICATIONS

This disclosure claims the benefit of U.S. Provisional Application No. 63/155,867, filed Mar. 3, 2021, which is hereby incorporated by reference herein in its entirety.

BACKGROUND

Numerous devices such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) sensors such as accelerometers and gyroscopes capture complex movements and determine orientation or direction. For example, smartphones are equipped with accelerometers and gyroscopes to understand the movement of the smartphone, to augment navigation systems that rely on Global Position System (GPS) information, and to perform numerous other functions. Wearable devices and internet-of-things (IoT) devices constantly measure movement and other characteristics of a person, animal, or electronic device. In another example, drones and aircraft determine orientation based on gyroscope measurements (e.g., roll, pitch, and yaw), and vehicles of all types implement assisted driving to improve safety (e.g., to recognize skid or roll-over conditions). In order to meet requirements for such varied and in many cases safety-critical applications requires MEMS sensors to operate under strict tolerances as far as accuracy and consistent operation over time.

SUMMARY

In an embodiment of the present disclosure, a microelectromechanical system (MEMS) gyroscope comprises a suspended spring-mass system located in a MEMS layer, wherein the suspended spring-mass system comprises a driven mass, and wherein the driven mass comprises at least one driven mass sense electrode responsive to a movement of the driven mass along a first axis and a drive amplitude electrode extending along a second axis that is perpendicular to the first axis. The MEMS gyroscope may further comprise at least one fixed drive sense electrode located in the MEMS layer adjacent to the at least one driven mass sense electrode and configured to capacitively engage with the driven mass sense electrode based on the movement of the driven mass along the first axis to generate a drive sense signal. The MEMS gyroscope may further comprise a fixed drive amplitude sense electrode located in the MEMS layer adjacent to the driven mass and configured to capacitively engage with the drive amplitude electrode based on the movement of the driven mass along the first axis. The MEMS gyroscope may further comprise processing circuitry configured to receive a drive amplitude signal based on an overlap of the drive amplitude electrode and the fixed drive amplitude sense electrode, monitor a change in the received drive amplitude signal, determine a drive reference signal based on the monitored change of the drive amplitude signal, and determine a drive motion of the driven mass based on the drive sense signal and the drive reference signal.

In an embodiment of the present disclosure, a MEMS gyroscope comprises a suspended spring-mass system located in a MEMS layer, wherein the suspended spring-mass system comprises a first driven mass and a second driven mass, wherein the first driven mass comprises at least one first driven mass sense electrode responsive to a movement of the first driven mass in a first direction and a first drive amplitude electrode facing in a second direction that is perpendicular to the first direction, and wherein the second driven mass comprises at least one second driven mass sense electrode responsive to a movement of the second driven mass in the first direction and a second drive amplitude electrode facing in the second direction. The MEMS gyroscope may further comprise at least one first fixed drive sense electrode located in the MEMS layer adjacent to the at least one first driven mass sense electrode and configured to capacitively engage with the first driven mass sense electrode based on the movement of the first driven mass in the first direction to generate a first drive sense signal. The MEMS gyroscope may further comprise at least one second fixed drive sense electrode located in the MEMS layer adjacent to the at least one second driven mass sense electrode and configured to capacitively engage with the second driven mass sense electrode based on the movement of the second driven mass in the first direction to generate a second drive sense signal. The MEMS gyroscope may further comprise a first fixed drive amplitude sense electrode located in the MEMS layer adjacent to the first driven mass and configured to capacitively engage with the first drive amplitude electrode based on the movement of the first driven mass in the first direction. The MEMS gyroscope may further comprise a second fixed drive amplitude sense electrode located in the MEMS layer adjacent to the second driven mass and configured to capacitively engage with the second drive amplitude electrode based on the movement of the second driven mass in the first direction. The MEMS gyroscope may further comprise processing circuitry configured to receive a first drive amplitude signal based on a first overlap of the first drive amplitude electrode and the first fixed drive amplitude sense electrode, monitor a change in the received first drive amplitude signal, determine a first drive reference signal based on the monitored change of the first drive amplitude signal, and determine a first drive motion of the first driven mass based on the drive sense signal and the drive reference signal, and wherein the processing circuitry is further configured to receive a second drive amplitude signal based on a second overlap of the second drive amplitude electrode and the second fixed drive amplitude sense electrode, monitor a change in the received second drive amplitude signal, determine a second drive reference signal based on the monitored change of the second drive amplitude signal, and determine a second drive motion of the second driven mass is based on the second drive sense signal and the second drive reference signal.

In an embodiment of the present disclosure, a method for operating a MEMS gyroscope may comprise steps including driving at least one driven mass of a suspended spring-mass system along a first axis, wherein the driven mass comprises at least one driven mass sense electrode responsive to the driving of the driven mass along a first axis and a drive amplitude electrode extending along a second axis that is perpendicular to the first axis. The steps of the method may further comprise receiving a drive sense signal, wherein the drive sense signal is based on a capacitive engagement of a driven mass sense electrode with the driven mass sense electrode during the driving of the driven mass along the first axis. The steps of the method may further comprise receiving a drive amplitude signal, wherein the drive amplitude signal is based on an overlap of the drive amplitude electrode and a fixed drive amplitude sense electrode during the driving of the driven mass along the first axis, monitoring a change in the received drive amplitude signal, determining a drive reference signal based on the monitored change of the drive amplitude signal, and determining a drive motion of the driven mass based on the drive sense signal and the drive reference signal.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 2A shows a top view of an illustrative driven mass of a MEMS gyroscope with a bump check in accordance with an embodiment of the present disclosure;

FIG. 2B shows a top view of an illustrative driven mass of a MEMS gyroscope making contact with a bump check in accordance with an embodiment of the present disclosure;

FIG. 5A shows an example diagram corresponding to FIG. 4 and depicting the drive amplitude electrode's displacement over time relative to an origin in accordance with an embodiment of the present disclosure;

FIG. 5B shows an example diagram corresponding to FIG. 4 and depicting the drive amplitude electrode's capacitive engagement with the fixed drive amplitude sense electrode over time in accordance with an embodiment of the present disclosure;

FIG. 5C shows an example diagram corresponding to FIG. 4 and depicting the drive amplitude electrode's capacitive engagement with the fixed drive amplitude sense electrode over the drive amplitude electrode's displacement in accordance with an embodiment of the present disclosure;

FIG. 7A shows an example diagram corresponding to FIG. 6 and depicting the drive amplitude electrode's displacement over time relative to an origin in accordance with an embodiment of the present disclosure;

FIG. 7B shows an example diagram corresponding to FIG. 6 and depicting the drive amplitude electrode's capacitive engagement with the fixed drive amplitude sense electrode over time in accordance with an embodiment of the present disclosure;

FIG. 7C shows an example diagram corresponding to FIG. 6 and depicting the drive amplitude electrode's capacitive engagement with the fixed drive amplitude sense electrode over the drive amplitude electrode's displacement in accordance with an embodiment of the present disclosure;

FIG. 9A shows an example diagram corresponding to FIG. 8 and depicting the drive amplitude electrode's displacement over time relative to an origin in accordance with an embodiment of the present disclosure;

FIG. 9B shows an example diagram corresponding to FIG. 8 and depicting the drive amplitude electrode's capacitive engagement with the fixed drive amplitude sense electrode over time in accordance with an embodiment of the present disclosure;

FIG. 9C shows an example diagram corresponding to FIG. 8 and depicting the drive amplitude electrode's capacitive engagement with the fixed drive amplitude sense electrode over the drive amplitude electrode's displacement in accordance with an embodiment of the present disclosure;

FIG. 12A shows an example diagram corresponding to FIG. 11 and depicting the drive amplitude electrode's displacement over time relative to an origin in accordance with an embodiment of the present disclosure;

FIG. 12B shows an example diagram corresponding to FIG. 11 and depicting the drive amplitude electrode's capacitive engagement with the fixed drive amplitude sense electrodes over time in accordance with an embodiment of the present disclosure;

FIG. 12C shows an example diagram corresponding to FIG. 11 and depicting the drive amplitude electrode's capacitive engagement with the fixed drive amplitude sense electrodes over the drive amplitude electrode's displacement in accordance with an embodiment of the present disclosure;

DETAILED DESCRIPTION OF DRAWINGS

Figure 1:
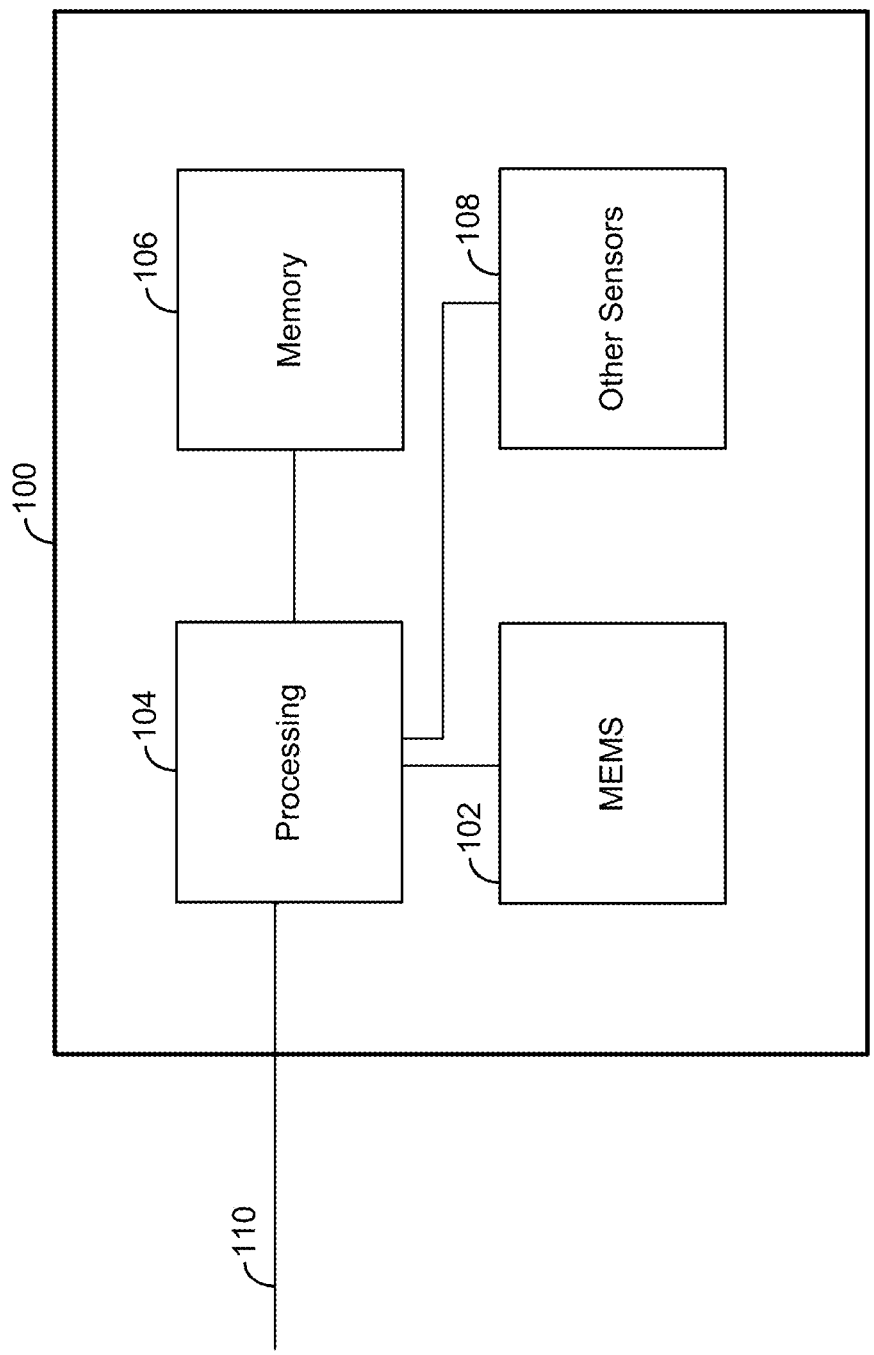
FIG. 1 shows an illustrative MEMS system in accordance with an embodiment of the present disclosure.

A MEMS sensor such as a MEMS gyroscope may include driven components such as a drive mass that is directly driven (e.g., by drive electrodes) as well as other components that are indirectly driven by the drive mass, such as a Coriolis mass or proof mass connected to the drive mass via springs and/or lever arms. The drive motion of the MEMS gyroscope is critical to the overall operation of the MEMS sensor, since a response of the sensor to force being sensed (e.g., angular velocity) is based at least in part on the drive motion. Accordingly, a drive motion of one or more of the driven components in response to a particular applied drive force (e.g., a drive signal imparted by adjacent drive electrodes) is measured in order to ensure that the MEMS gyroscope is functioning properly and that sense measurements are appropriately determined and scaled.

The driven mass includes additional drive amplitude sense electrodes that extend from (or in some embodiments, into) the driven mass in a direction perpendicular to the drive motion of the driven mass. The drive amplitude sense electrodes create a discontinuity along an edge of the driven mass that can be identified based on a change in capacitance as the discontinuity moves past a fixed location, such as a fixed drive amplitude sense electrode. In some embodiments, the discontinuity may extend in a second direction (e.g., a z-direction) perpendicular to the drive motion of the driven mass. For example, the discontinuity may extend from beneath the driven mass pointing downwards. By designing the driven mass to include one or more drive amplitude sense electrodes at a particular location on the driven mass, and the MEMS gyroscope to have a fixed drive amplitude sense electrode at a known fixed location, the absolute location of the driven mass within the MEMS gyroscope can be accurately determined. A variety of electrode shapes, sizes, and patterns may be utilized for the drive amplitude sense electrodes and fixed drive amplitude sense electrodes, resulting on particular signal patterns that may be utilized such as to avoid or compensate for capacitive fringing effects, provide more accurate measurements of relative location, and the like. For example, a first drive sense amplitude having a higher accuracy or greater extent of movement may be utilized during production and trimming, while a lower accuracy or smaller movement amplitude drive sense electrode may be used during sensor operation.

The output value corresponding to the capacitance of the respective drive amplitude sense electrodes may be used to better operate the drive functionality of the MEMS gyroscope. Because the absolute position of the driven mass is accurately determined, this position can be associated with a drive signal that causes such a movement (e.g., voltage, signal pattern, duty cycle, etc.) and/or a measured drive sense value that corresponds to the known position. Accordingly, drive parameters are accurately set and monitored based on a known absolute location corresponding to those drive parameters.

FIG. 1 shows an illustrative MEMS system 100 in accordance with some embodiments of the present disclosure. Although particular components are depicted in FIG. 1, it will be understood that other suitable combinations of MEMS, processing components, memory, and other circuitry may be utilized as necessary for different applications and systems. In certain embodiments of the present disclosure, the circuitry, devices, systems, and methods described herein may be described in the context of a system including a drive amplitude electrode attached to a driven mass of a MEMS gyroscope that capacitively engages with a fixed drive amplitude sense electrode to determine, via processing circuitry, the position of the driven mass and a corresponding drive amplitude. However, it will be understood that the circuitry, devices, systems, and methods described herein may be applied to other types of MEMS sensors. For example, the systems and methods described herein may apply to a variety of MEMS sensors types including movable components and/or masses.

Processing circuitry 104 may include one or more components providing necessary processing based on the requirements of the MEMS system 100. In some embodiments, processing circuitry 104 may include hardware control logic that may be integrated within a chip of a sensor (e.g., on a substrate or capacitor of a MEMS sensor 102 or other sensor 108, or on an adjacent portion of a chip to the MEMS sensor 102 or other sensor 108) to control the operation of the MEMS sensor 102 or other sensors 108 and perform aspects of processing for the MEMS sensor 102 or the other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS sensor 102 by interacting with the hardware control logic and processing signals received from MEMS sensor 102. The microprocessor may interact with other sensors in a similar manner. In some embodiments, some or all of the functions of the processing circuitry 104, and in some embodiments, of memory 106, may be implemented on an application specific integrated circuit ("ASIC") and/or a field programmable gate array ("FPGA"). Accordingly, the processing circuitry may include a variety of processing circuitry types, which may be individually and/or collectively distributed over multiple locations, devices, dies, circuit boards, and the like.

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a SPI or I2C bus, in automotive applications a controller area network (CAN) or Local Interconnect Network (LIN) bus, or in other applications suitably wired or wireless communications interfaces as is known in the art). The processing circuitry 104 may convert signals received from the MEMS sensor 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor 102 or other MEMS sensors 108.

In some embodiments, certain types of information may be determined based on data from multiple MEMS inertial sensors 102 and other sensors 108, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In accordance with the present disclosure, a drive signal may be generated and applied to one or more electrodes of MEMS sensor 102 such as a gyroscope, which in turn may cause a movement of certain masses of a suspended spring-mass system to move in response to the drive signal. The mass or masses that are caused to move by the drive signal are referred to herein as a driven mass or driven masses, and may include masses (e.g., a drive mass) that are caused to move directly by the drive signal (e.g., the drive signal is imparted directly on the drive mass) as well as masses that are caused to move indirectly via the movement of other components of the suspended spring-mass system of the MEMS sensor 102, such as Coriolis masses or proof masses that are driven indirectly via a drive mass via springs and/or lever arms. The driven mass may include a drive amplitude electrode (e.g., when extending from the driven mass a "tab," and when extending into the drive mass a "notch") on to one of its faces, which capacitively engages with a fixed drive amplitude sense electrode located adjacent to the driven mass, such as in the MEMS layer of MEMS sensor 102. The driven mass may follow an oscillatory path in accordance with the frequency of the drive signal. Accordingly, the drive amplitude electrode may generate a maximum capacitance each time it completely aligns with the fixed drive amplitude sense electrode during the driven mass's oscillations, which allows for a precise determination of the driven mass's displacement and an accurate measurement of an amplitude of the drive motion.

FIG. 2A shows a top view of an illustrative driven mass of a MEMS gyroscope with a bump check in accordance with an embodiment of the present disclosure, while FIG. 2B shows a top view of an illustrative driven mass of a MEMS gyroscope making contact with a bump check in accordance with an embodiment of the present disclosure. In the depicted embodiment, an exemplary MEMS gyroscope 200 includes a driven mass that has a particular configuration for conducting a bump check, including a driven mass 202, a bump stop 204, a drive displacement 206 (e.g., $X_{drive}$) along a first axis, a contact point 208 between driven mass 202 and bump stop 204, and a maximum drive displacement 210 along the first axis. The illustrative MEMS gyroscope 200 of FIG. 2A and FIG. 2B is depicted as an in-plane driven gyroscope, but it will be understood that the present disclosure relates to other gyroscope configurations and other types of MEMS sensors. Although particular components are depicted in certain configurations for MEMS gyroscope 200, it will be understood that components may be removed, modified, or substituted and that additional components (e.g., drive electrodes, additional driven masses, springs, lever arms, processing circuitry, etc.) may be included in certain embodiments.

In FIG. 2A, the exemplary MEMS gyroscope 200 includes driven mass 202, which receives a drive signal such as via drive electrodes (not depicted) and accordingly oscillates along a first axis in accordance with the drive signal. During normal operation, the driven mass moves in accordance with the drive signal, and that drive motion is measured by a change in capacitance between an edge of the drive mass and one or more drive sense electrodes (not depicted in FIG. 2A) located adjacent to the drive mass, for example, adjacent to bump stop 204.

One manner of determining proper scaling for a drive sense signal may be to determine the drive sense signal that corresponds to the driven mass contacting bump stop 204. Once the drive sense signal is thus correlated, estimates of the drive motion may be determined based on a proportional response of the drive sense signal compared to the maximum associated with contacting the bump stop. For example, the drive amplitude of the drive signal is incrementally increased until driven mass 202 makes contact with bump stop 204, which acts as a mechanical limit switch for driven mass 202 to determine a maximum drive displacement 210 along the first axis. The drive sense signal associated with this maximum drive displacement 210 is then determined and estimates of drive motion associated with various drive sense values may then be estimated.

FIG. 2B depicts contact 208 between driven mass 202 and bump stop 204, which, in some embodiments, may generate loose particles within the MEMS layer, or otherwise may result in damage or wear over time. Accordingly, such a method of calibrating the drive sense signal may only be able to be used sparingly, such as during an initial test of the MEMS gyroscope or only occasionally during the sensor's lifetime. Moreover, contact between driven mass 202 and bump stop 204 may happen at an unintended location or direction (e.g., lateral contact vs. frontal contact), for example, based on manufacturing tolerances and/or external motion. Maximum drive displacement 210 along the first axis represents the distance driven mass 202 covers before making contact with bump stop 204. Maximum drive displacement 210 solely checks for a maximum amplitude of the received drive signal, and, in some embodiments, maximum drive displacement 210 may differ from a designed value in case of a non-linearity in the drive signal (e.g., lateral contact).

Figure 3B:
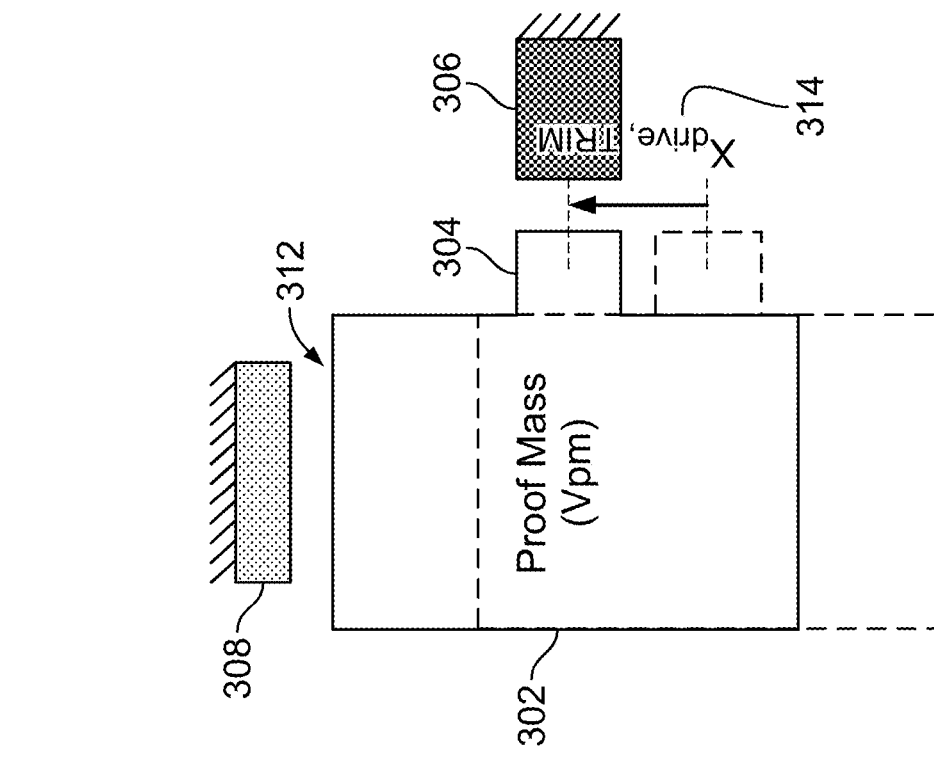
FIG. 3B shows a top view of an illustrative driven mass of a MEMS gyroscope with an actuated drive amplitude electrode in accordance with an embodiment of the present disclosure.
Figure 3A:
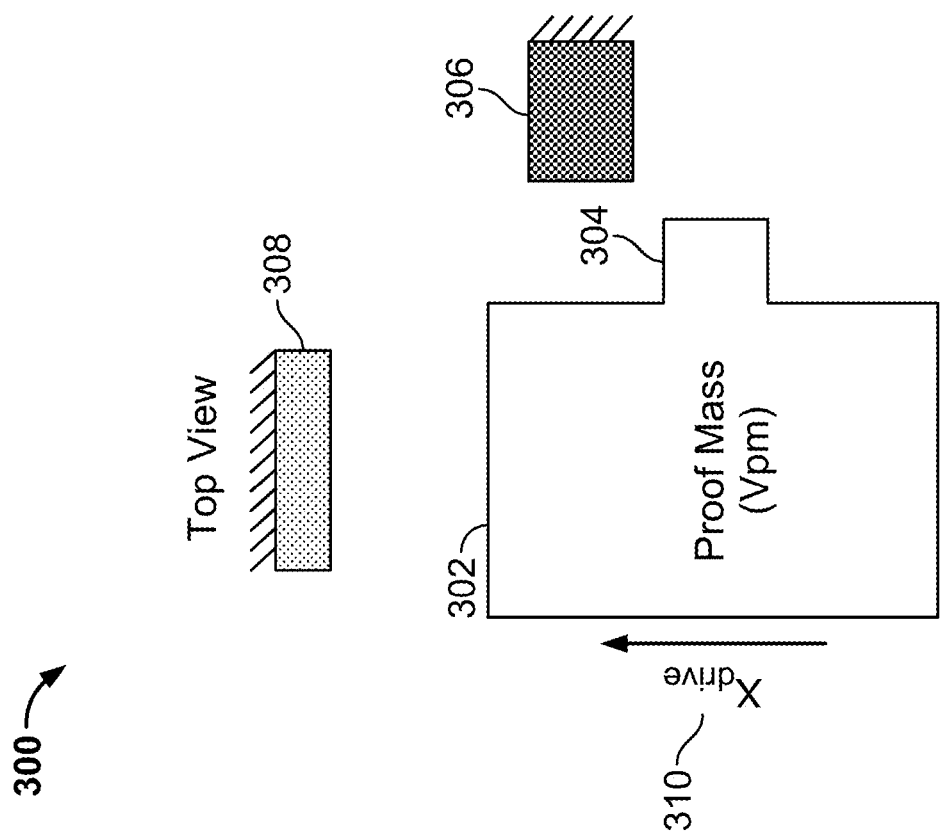
FIG. 3A shows a top view of an illustrative driven mass of a MEMS gyroscope including a drive amplitude electrode in accordance with an embodiment of the present disclosure.

FIG. 3A shows a top view of an illustrative driven mass of a MEMS gyroscope including a drive amplitude electrode in accordance with an embodiment of the present disclosure, while FIG. 3B shows a top view of an illustrative driven mass of a MEMS gyroscope with an actuated drive amplitude electrode in accordance with an embodiment of the present disclosure. In the depicted embodiment, a driven mass of an exemplary MEMS gyroscope 300 has a particular configuration for determining a drive amplitude based on a drive displacement 310 of a driven mass 302, which further includes a drive amplitude electrode 304 (e.g., a tab), a fixed drive amplitude sense electrode 306, a bump stop 308 (corresponding to bump stop 204 of FIG. 2A and FIG. 2B), a drive displacement 310 (e.g., $X_{drive}$) along a first axis, and a fixed drive sense electrode (not depicted). The illustrative MEMS gyroscope 300 of FIG. 3A and FIG. 3B is depicted as an in-plane driven mass of a gyroscope, but it will be understood that the present disclosure relates to other gyroscope configurations and MEMS sensor types. Although particular components are depicted in certain configurations for MEMS gyroscope 300, it will be understood that components may be removed, modified, or substituted and that additional components (e.g., drive electrodes, additional driven masses, springs, lever arms, processing circuitry, etc.) may be added in certain embodiments.

In FIG. 3A, driven mass 302, which couples to processing circuitry (not depicted), receives a drive signal via drive electrodes (not depicted) and oscillates accordingly along the first axis in the x-direction. At least one driven mass sense electrode (e.g., the driven mass itself) capacitively engages with one or more drive sense electrodes (e.g., with a signal that changes in a generally proportional manner to movement along the first axis), resulting in a drive sense signal. The fixed drive sense electrode (not depicted) is located adjacent to the driven mass sense electrode and capacitively engages with the driven mass sense electrode based on the movement of the driven mass 302, along the first axis, to generate a drive sense signal. In some embodiments, there may be any suitable number of driven mass sense electrodes coupled to driven mass 302 at any suitable location on driven mass 302. Accordingly, in some embodiments, there may be any suitable number of corresponding fixed drive sense electrodes adjacent to the number of driven mass sense electrodes.

Drive amplitude electrode 304 extends from a face of driven mass 302 and is oriented along a second axis (e.g., the y-axis) that is perpendicular to the first axis (e.g., the x-axis). Drive amplitude electrode 304 moves according to the oscillatory motion of driven mass 302 along the first axis and capacitively engages with a fixed drive amplitude sense electrode 306 accordingly. Unlike the drive sense electrodes, the sensed capacitance between drive amplitude electrode 304 and the fixed drive amplitude sense electrode 306 changes solely based on the overlap between the drive amplitude electrode 304 and the fixed drive amplitude sense electrode 306, including a maximum at any portions of the movement of the drive amplitude electrode 304 at which there is complete overlap. It will be understood that drive amplitude electrode 304 may be configured to have either maximum or minimum capacitance variation in correspondence to target displacement.

Although depicted as a rectangular tab in FIGS. 3A and 3B, and in other figures herein, it will be understood that the drive amplitude electrode 304 and/or the fixed drive amplitude sense electrode 306 may have other shapes and configurations, such as polygons, semicircles, etc., for example, to generate desirable signals for ease of processing. It will be understood that other shapes and configurations may enhance capacitance transition and reject noise or reduce fringing field effects. In some embodiments, drive amplitude electrode 304 may be any suitable size and a driven mass may include any suitable number of drive amplitude electrodes 304 and/or fixed drive amplitude sense electrodes 306. Fixed drive amplitude sense electrode 306 is located adjacent to the driven mass 302 (e.g., in the MEMS layer of the sensor) and capacitively engages with drive amplitude electrode 304 based on the drive amplitude electrode 304 location. For example, drive amplitude electrode 304, attached to driven mass 302, may be positioned such that it does not overlap with the fixed drive amplitude sense electrode 306 when the driven mass is at rest or at a base location within its oscillation, and accordingly, record a minimal capacitance with fixed drive amplitude sense electrode 306. Conversely, drive amplitude electrode 304 may align with fixed drive amplitude sense electrode 306 and generate a maximum capacitance when the drive motion of the driven mass causes a total overlap between drive amplitude electrode 304 and fixed drive amplitude sense electrode 306, as depicted in FIG. 3B. It will be understood that fixed drive amplitude sense electrode 306 is placed in a desired location during layout design of MEMS gyroscope 300, such that the relative location of drive amplitude electrode 304 to the fixed drive amplitude sense electrode 306 when the driven mass is at rest is known with a relatively high degree of certainty.

In FIG. 3B, no contact 312 is made between driven mass 302 and bump stop 308. Nonetheless, the actual distance that the driven mass is moves in response to a particular drive force may be estimated due to the drive amplitude electrode 304, attached to driven mass 302, aligning with fixed drive amplitude sense electrode 306 during an oscillation of driven mass 302 along the first axis, which results in a maximum capacitance variation. Accordingly, it is possible to identify that driven mass 302 has reached a desired target drive amplitude, which can then be associated with a corresponding drive sense measurement. In some embodiments, the overlap of the drive amplitude electrode 304 and the fixed drive amplitude sense electrode 306 may occur during the initial trim of the MEMS gyroscope 300 such as during manufacturing. In some embodiments, the overlap of the drive amplitude electrode 304 and the fixed drive amplitude sense electrode 306 may occur periodically during the MEMS gyroscope's 300 operation, or in real-time to more accurately calibrate drive sense measurements, without damage to components. Maximum capacitance measurement generated by the alignment of drive amplitude electrode 304 and fixed drive amplitude sense electrode 306 does not depend on gaps and is not affected by fabrication process variations (e.g., etching bias). Consequently, it is possible to identify the actual displacement of driven mass 302 based on a designed location of the fixed drive amplitude sense electrode 306 with respect to driven mass 302. It will be understood that MEMS gyroscope 300 depicts a non-destructive measurement, which may be used on all applicable components. Trim displacement 314 along the first axis represents the distance covered by drive amplitude electrode 304 to fully overlap with fixed drive amplitude sense electrode 306 and generate a maximum capacitance. Processing circuitry (not depicted) couples to driven mass 302, drive amplitude electrode 304, and fixed drive amplitude sense electrode 306. Processing circuitry receives a drive amplitude signal based on the alignment of drive amplitude electrode 304 and fixed drive amplitude sense electrode 306, monitors a change in the received drive amplitude signal, determines a drive reference signal based on the monitored change in the drive amplitude signal, and determines a drive amplitude based on the drive sense signal and the drive reference signal. In some embodiments, processing circuitry may be external to the MEMS gyroscope 300. In some embodiments, MEMS gyroscope 300 uses in-plane electrodes and may not depend on bonding misalignment. It will be understood that MEMS gyroscope 300 may generate capacitance variation (e.g., jump) based on the layout geometry of MEMS gyroscope 300.

Figure 4:
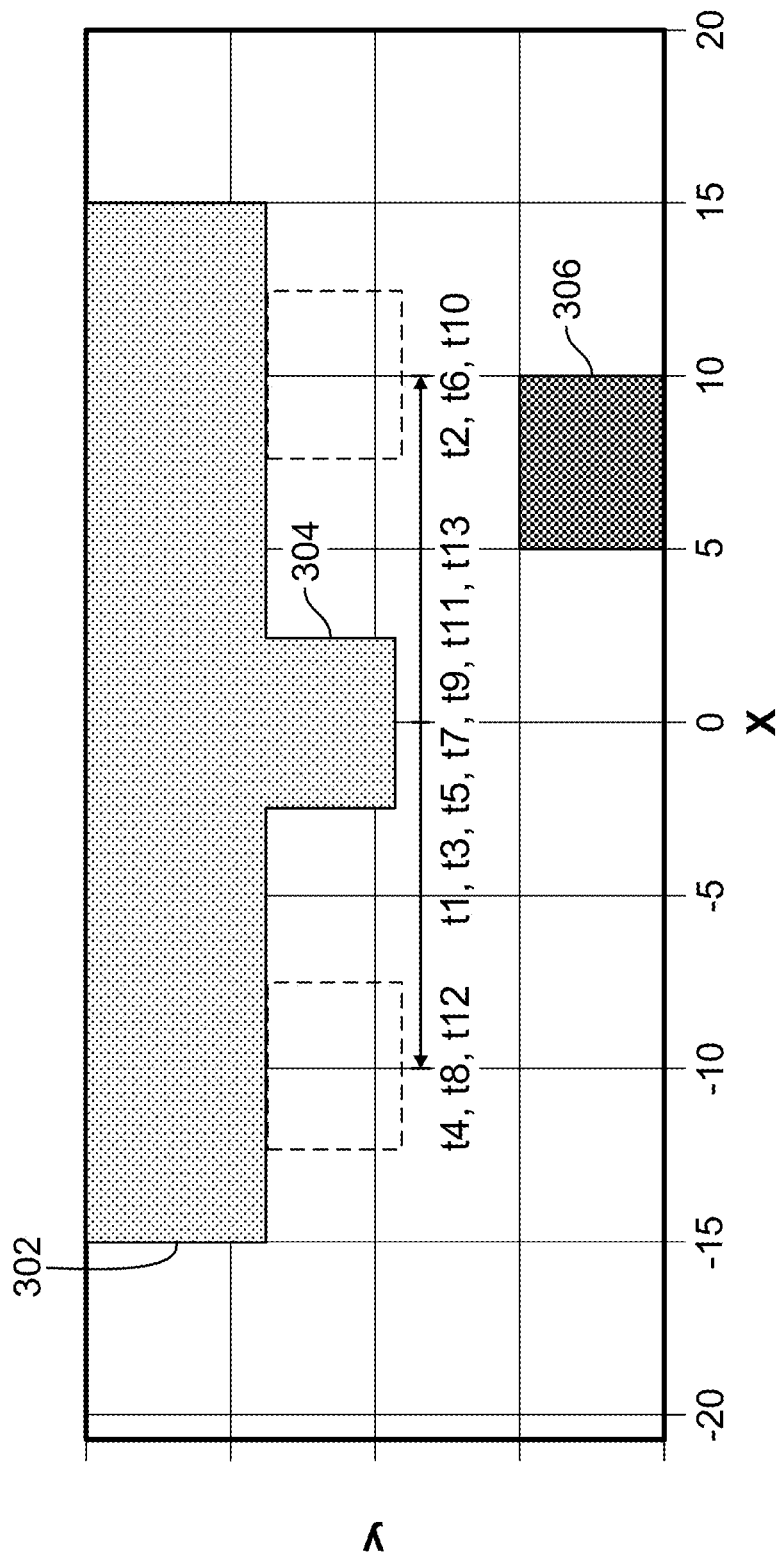
FIG. 4 shows an example diagram depicting a drive amplitude electrode, with a substantially similar width to a fixed drive amplitude sense electrode, capacitively engaging with the fixed drive amplitude sense electrode over time in accordance with an embodiment of the present disclosure.

FIG. 4 shows an example diagram depicting a drive amplitude electrode, with a substantially similar width to a fixed drive amplitude sense electrode, capacitively engaging with the fixed drive amplitude sense electrode over time in accordance with an embodiment of the present disclosure. FIG. 4 includes driven mass 302, drive amplitude electrode 304, and fixed drive amplitude sense electrode 306, labeled in a similar manner to the same components of FIG. 3. Although FIG. 4 depicts drive amplitude electrode 304 with a displacement of 10 units in either direction, it will be understood that drive amplitude electrode 304 may be displaced any suitable distance, with respect to the origin, without driven mass 302 making contact with a bump stop (not depicted). As used herein, "unit" or "units" refers to a dimensionless unit corresponding to relative respective distances and sizes for components and motions described herein, and can refer to any suitable actual distance such as a number of nanometers (nm), micrometers (µm), millimeters (mm), or other suitable measurement units or multiples thereof. In some embodiments, any suitable number of timepoints may track the position of drive amplitude electrode 304 while it oscillates, in accordance with the received drive signal, along the first axis. In the embodiment of FIG. 4 at a first time t1, the drive amplitude electrode 304 is centered at 0 units. It then oscillates to a second position of 10 units at time t2, returns to the center point at time t3, and then oscillates to a third position of −10 units at time t4. This oscillation then continues as depicted by time points t5 (0 units), t6 (10 units), t7 (0 units), t8 (−10 units), t9 (0 units), t10 (10 units), t11 (0 units), t12 (−10 units), and t13 (0 units).

Drive amplitude electrode 304 has a substantially similar width to fixed drive amplitude sense electrode 306, but it will be understood that drive amplitude electrode 304 may have any suitable width with respect to fixed drive amplitude sense electrode 306. Drive amplitude electrode 304, attached to driven mass 302, moves in accordance with driven mass 302 and corresponds to timepoints depicted in FIG. 4. The timepoints in FIG. 4 depict an exemplary oscillatory path of drive amplitude electrode 304. Fixed drive amplitude sense electrode 306 is centered at a distinct distance (e.g., between 5 units and 10 units) from the origin and is approximately 5 units wide. It will be understood that fixed drive amplitude sense electrode 306 may be located at any suitable distance relative to the origin. Fixed drive amplitude sense electrode 306 capacitively engages with drive amplitude electrode 304 based on drive amplitude electrode's 304 oscillatory motion.

FIG. 5A shows an example diagram corresponding to FIG. 4 and depicting the drive amplitude electrode's displacement over time relative to an origin in accordance with an embodiment of the present disclosure. FIG. 5A depicts the oscillatory motion of the drive amplitude electrode, attached to the driven mass, with respect to the origin over time. The drive amplitude electrode displaces a maximum 10 units in either direction with respect to the origin over time, but it will be understood that the drive amplitude electrode may be displaced any suitable distance in response to the received drive signal.

FIG. 5B shows an example diagram corresponding to FIG. 4 and depicting the drive amplitude electrode's capacitive engagement with the fixed drive amplitude sense electrode over time in accordance with an embodiment of the present disclosure. Capacitive spikes in FIG. 5B correspond with the drive amplitude electrode momentarily aligning with the fixed drive amplitude sense electrode's fixed position at approximately 7.5 units to have complete overlap along the drive amplitude electrode's oscillatory motion, as depicted in FIG. 4. The diagram depicted in FIG. 5B corresponds with the timepoints depicted in FIG. 4. For example, spikes occur in between timepoints t1 and t2 and in between timepoints t2 and t3 before no capacitive engagement is generated at timepoint t4 due to the drive amplitude electrode being farthest away from the fixed drive amplitude sense electrode within its oscillatory path. Spikes reappear in between timepoints t5 and t6 and in between timepoints t6 and t7 before recording no capacitive engagement at timepoint t8. Spikes are visible in between timepoints t9 and t10 as well as in between timepoints t10 and t11 before failing to record a capacitance at timepoint t12. It will be understood that the path of the drive amplitude electrode may be tracked for any suitable amount of time with any suitable amount of timepoints.

FIG. 5C shows an example diagram corresponding to FIG. 4 and depicting the drive amplitude electrode's capacitive engagement with the fixed drive amplitude sense electrode over the drive amplitude electrode's displacement in accordance with an embodiment of the present disclosure. It will be understood that a capacitance fringing field is neglected for the sake of simplicity but may be considered as appropriate. A maximum capacitance 502 is recorded by the MEMS gyroscope at approximately 7.5 units (e.g., the location of total overlap with fixed drive amplitude sense electrode 306 in FIG. 4) due to the drive amplitude electrode momentarily aligning with the fixed drive amplitude sense electrode. Trimmed fixed drive amplitude sense electrode 504 (corresponding to fixed drive amplitude sense electrode 306 of FIG. 4) denotes the location of the center point of the fixed drive amplitude sense electrode (e.g., where maximum capacitance is generated).

Figure 6:
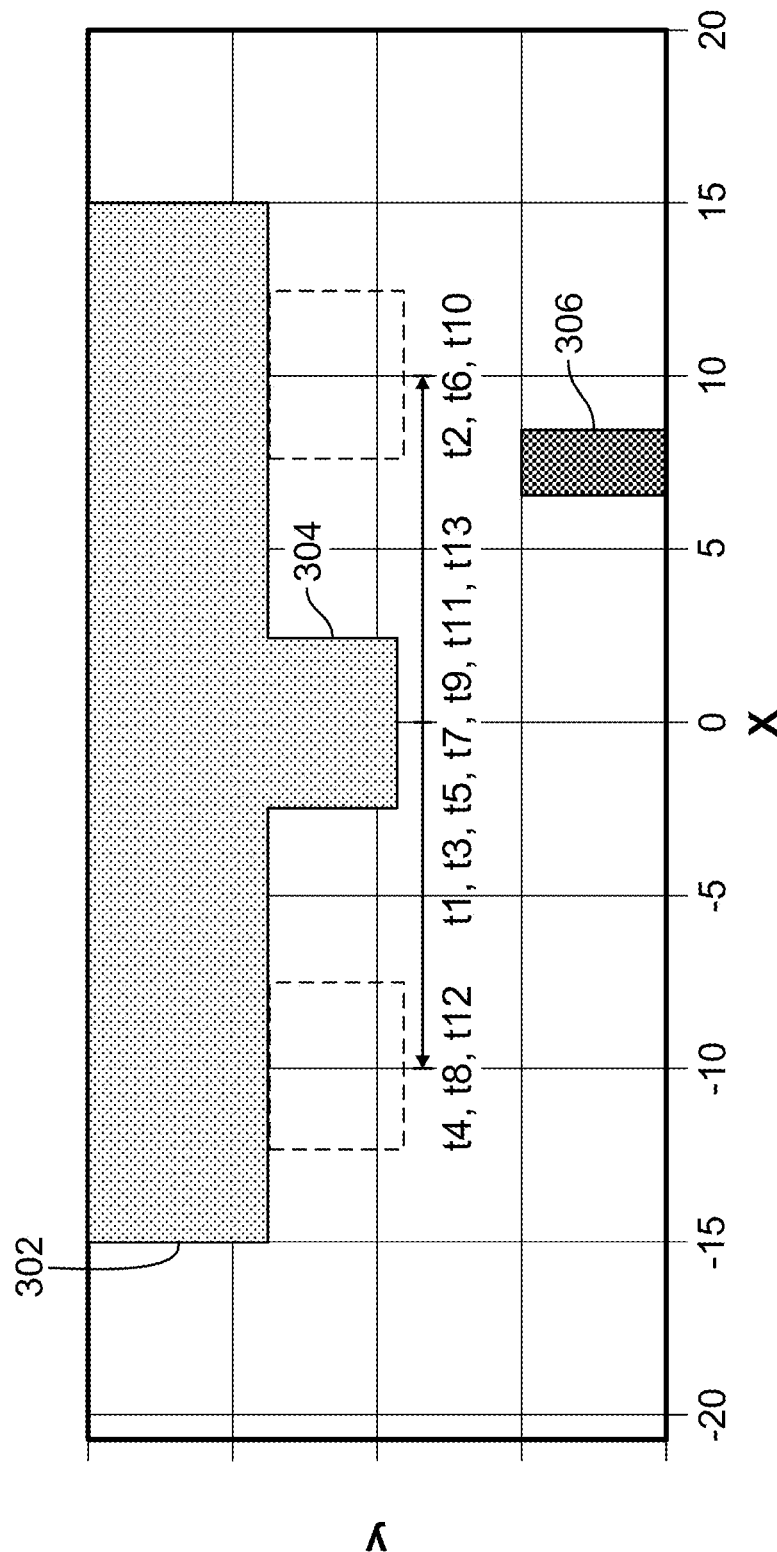
FIG. 6 shows an example diagram depicting a drive amplitude electrode, with a width greater than a fixed drive amplitude sense electrode, capacitively engaging with the fixed drive amplitude sense electrode over time in accordance with an embodiment of the present disclosure.

FIG. 6 shows an example diagram depicting a drive amplitude electrode, with a width greater than a fixed drive amplitude sense electrode, capacitively engaging with the fixed drive amplitude sense electrode over time in accordance with an embodiment of the present disclosure. FIG. 6 includes driven mass 302, drive amplitude electrode 304, and fixed drive amplitude sense electrode 306, labeled in a similar manner as corresponding components of FIG. 3. Although FIG. 6 depicts drive amplitude electrode 304 with a displacement of 10 units in either direction, it will be understood that drive amplitude electrode 304 may be displaced any suitable distance, with respect to the origin, without driven mass 302 making contact with a bump stop (not depicted). In some embodiments, any suitable number of timepoints may track the position of drive amplitude electrode 304 while it oscillates, in accordance with the received drive signal, along the first axis. Drive amplitude electrode 304 has a greater width than fixed drive amplitude sense electrode 306, but it will be understood that drive amplitude electrode 304 may have any suitable width with respect to fixed drive amplitude sense electrode 306. Drive amplitude electrode 304, attached to driven mass 302, moves in accordance with driven mass 302 and corresponds to timepoints depicted in FIG. 6. The timepoints in FIG. 6 depict an exemplary oscillatory path of drive amplitude electrode 304, which may follow any suitable path, as described herein. Fixed drive amplitude sense electrode 306 is centered at a distinct distance (e.g., between 5 units and 10 units) from the origin. It will be understood that fixed drive amplitude sense electrode 306 may be located at any suitable distance relative to the origin. Fixed drive amplitude sense electrode 306 capacitively engages with drive amplitude electrode 304 based on drive amplitude electrode's 304 oscillatory motion. In the embodiment depicted in FIG. 6, because of the differences in the respective sizes of the drive amplitude electrode 304 and fixed drive amplitude sense electrode 306, there is a longer period of complete overlap between the two electrodes, as compared to the embodiment depicted in FIG. 3.

FIG. 7A shows an example diagram corresponding to FIG. 6 and depicting the drive amplitude electrode's displacement over time relative to an origin in accordance with an embodiment of the present disclosure. FIG. 7A depicts the oscillatory motion of the drive amplitude electrode, attached to the driven mass, with respect to the origin over time. The drive amplitude electrode displaces a maximum 10 units in either direction with respect to the origin over time, but it will be understood that the drive amplitude electrode may be displaced any suitable distance in response to the received drive signal.

FIG. 7B shows an example diagram corresponding to FIG. 6 and depicting the drive amplitude electrode's capacitive engagement with the fixed drive amplitude sense electrode over time in accordance with an embodiment of the present disclosure. Saturated capacitive spikes in FIG. 7B correspond with the drive amplitude electrode completely overlapping with the fixed drive amplitude sense electrode's fixed position, as depicted in FIG. 6, along the drive amplitude electrode's oscillatory motion. The saturated capacitances measured in FIG. 7B are a result of the difference in width between the drive amplitude electrode and the fixed drive amplitude sense electrode. The diagram depicted in FIG. 7B corresponds with the timepoints depicted in FIG. 6. For example, saturated spikes occur in between timepoints t1 and t2 and in between timepoints t2 and t3 before generating no capacitive engagement at timepoint t4 due to the drive amplitude electrode being farthest away from the fixed drive amplitude sense electrode within its oscillatory motion. Saturated spikes reappear in between timepoints t5 and t6 and in between timepoints t6 and t7 before failing to record a capacitance at timepoint t8. Saturated spikes are again visible in between timepoints t9 and t10 and in between timepoints t10 and t11 before no capacitive engagement is generated at timepoint t12. It will be understood that the path of the drive amplitude electrode may be tracked for any suitable amount of time with any suitable amount of timepoints.

FIG. 7C shows an example diagram corresponding to FIG. 6 and depicting the drive amplitude electrode's capacitive engagement with the fixed drive amplitude sense electrode over the drive amplitude electrode's displacement in accordance with an embodiment of the present disclosure. A saturated capacitance 702 is recorded by the MEMS gyroscope over a range that is centered at approximately 7.5 units (e.g., the location of fixed drive amplitude sense electrode 306 in FIG. 6) due to the drive amplitude electrode completely overlapping with the fixed drive amplitude sense electrode. Trimmed fixed drive amplitude sense electrode 702 (corresponding to fixed drive amplitude sense electrode 306 of FIG. 6) denotes the location of the fixed drive amplitude sense electrode (e.g., where the saturated capacitance is generated).

Figure 8:
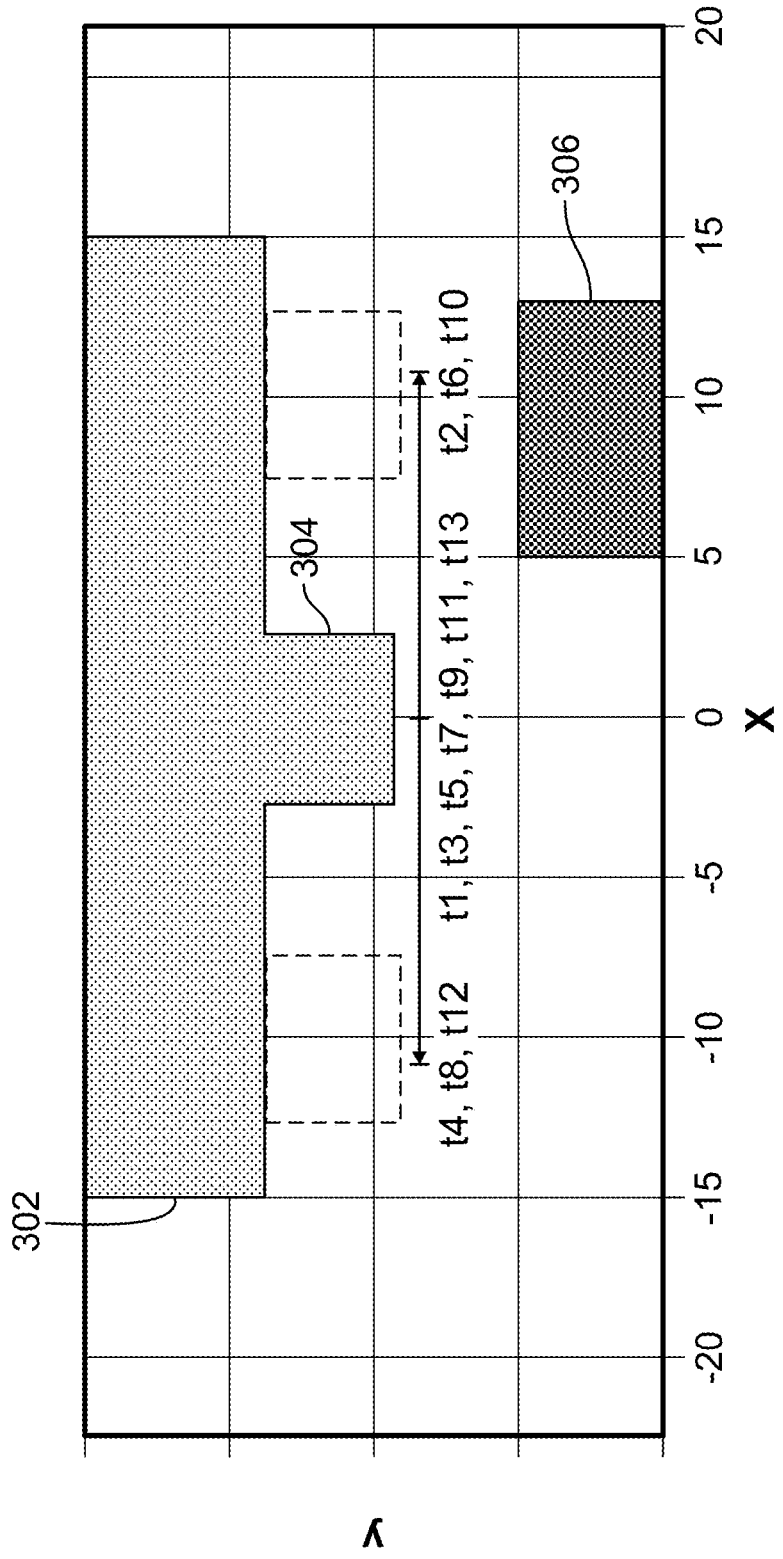
FIG. 8 shows an example diagram depicting a drive amplitude electrode, with a width less than a width of a fixed drive amplitude sense electrode, capacitively engaging with the fixed drive amplitude sense electrode over time in accordance with an embodiment of the present disclosure.

FIG. 8 shows an example diagram depicting a drive amplitude electrode, with a width less than a width of a fixed drive amplitude sense electrode, capacitively engaging with the fixed drive amplitude sense electrode over time in accordance with an embodiment of the present disclosure. FIG. 8 includes driven mass 302, drive amplitude electrode 304, and fixed drive amplitude sense electrode 306, labeled in a similar manner as similar components depicted in FIG. 3. Although FIG. 8 depicts drive amplitude electrode 304 with a displacement of 10 units in either direction, it will be understood that drive amplitude electrode 304 may be displaced any suitable distance, with respect to the origin, without driven mass 302 making contact with a bump stop (not depicted). In some embodiments, any suitable number of timepoints may track the position of drive amplitude electrode 304 while it oscillates, in accordance with the received drive signal, along the first axis. Drive amplitude electrode 304 has a narrower width than fixed drive amplitude sense electrode 306, but it will be understood that drive amplitude electrode 304 may have any suitable width with respect to fixed drive amplitude sense electrode 306. Drive amplitude electrode 304, attached to driven mass 302, moves in accordance with driven mass 302 and corresponds to timepoints depicted in FIG. 8. The timepoints in FIG. 8 depict an exemplary oscillatory path of drive amplitude electrode 304, which may follow any suitable path. Fixed drive amplitude sense electrode 306 is centered at a distinct distance (e.g., between 5 units and 15 units) from the origin. It will be understood that fixed drive amplitude sense electrode 306 may be located at any suitable distance relative to the origin. Fixed drive amplitude sense electrode 306 capacitively engages with drive amplitude electrode 304 based on drive amplitude electrode's 304 oscillatory motion.

FIG. 9A shows an example diagram corresponding to FIG. 8 and depicting the drive amplitude electrode's displacement over time relative to an origin in accordance with an embodiment of the present disclosure. FIG. 9A depicts the oscillatory motion of the drive amplitude electrode, attached to the driven mass, with respect to the origin over time. The drive amplitude electrode displaces a maximum 10 units in either direction with respect to the origin over time, but it will be understood that the drive amplitude electrode may be displaced any suitable distance in response to the received drive signal.

FIG. 9B shows an example diagram corresponding to FIG. 8 and depicting the drive amplitude electrode's capacitive engagement with the fixed drive amplitude sense electrode over time in accordance with an embodiment of the present disclosure. Saturated capacitive spikes in FIG. 9B correspond with the drive amplitude electrode completely overlapping with the fixed drive amplitude sense electrode's fixed position over a range of positions, as depicted in FIG. 8, along the drive amplitude electrode's oscillatory motion. The saturated capacitances measured in FIG. 9B are a result of the difference in width between the drive amplitude electrode and the fixed drive amplitude sense electrode. Unlike FIG. 5B and FIG. 7B, FIG. 9B doesn't show any dips in between peaks because the fixed drive amplitude sense electrode extends approximately from 5 units to 13 units, with respect to the origin, which completely overlaps with the 5 units wide drive amplitude electrode even at its maximum displacement from center. Accordingly, a constant, saturated capacitance is generated during that distance due to the drive amplitude electrode being narrower in width. The diagram depicted in FIG. 9B corresponds to the timepoints depicted in FIG. 8. For example, saturated peaks occur between timepoints t1 and t3 before generating no capacitance at timepoint t4 due to the drive amplitude electrode being farthest away from the fixed drive amplitude sense electrode within its oscillation. Saturated peaks reappear in between timepoints t5 and t7 before failing to produce any capacitance at timepoint t8. Saturated peaks are visible again in between timepoints t9 and t11 before producing no capacitance at timepoint t12. It will be understood that the path of the drive amplitude electrode may be tracked for any suitable amount of time with any suitable number of timepoints.

FIG. 9C shows an example diagram corresponding to FIG. 8 and depicting the drive amplitude electrode's capacitive engagement with the fixed drive amplitude sense electrode over the drive amplitude electrode's displacement in accordance with an embodiment of the present disclosure. A saturated capacitance 902 is recorded by the MEMS gyroscope beginning at approximately 7.5 units (e.g., the location where the drive amplitude electrode begins to fully overlap with the fixed drive amplitude sense electrode 306 in FIG. 8) due to the drive amplitude electrode beginning to completely overlap with the fixed drive amplitude sense electrode.

Figure 10:
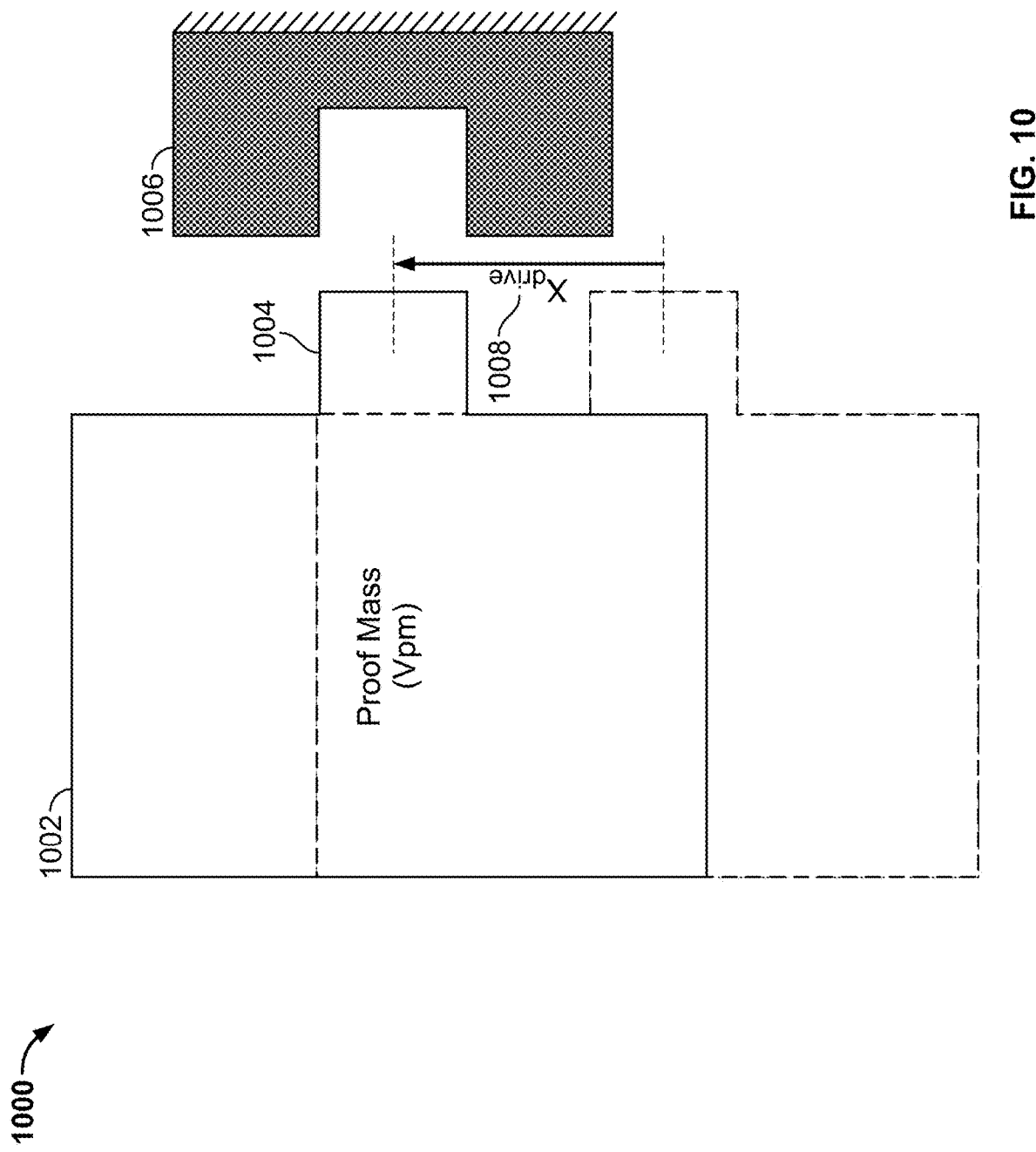
FIG. 10 shows an illustrative driven mass of a MEMS gyroscope with multiple fixed drive amplitude sense electrodes in accordance with an embodiment of the present disclosure.

FIG. 10 shows an illustrative driven mass of a MEMS gyroscope with multiple fixed drive amplitude sense electrodes in accordance with an embodiment of the present disclosure. FIG. 10 includes driven mass 1002 (e.g., functioning as a drive sense electrode), drive amplitude electrode 1004, fixed drive amplitude sense electrode 1006, drive displacement 1008, and one or more fixed drive sense electrodes (not depicted). Fixed drive amplitude sense electrode 1006 includes a gap in between multiple electrodes to detect the intermediate positions of driven mass 1002 (and consequently intermediate amplitude levels) and to compensate for a fringing field effect that may occur in some instances. Symmetry in the geometry of the multiple electrodes results in compensation of the contribution of fringing field effects from each electrode. In some embodiments, fixed drive amplitude sense electrode 1006 may include any suitable number of gaps and any suitable number of electrodes. In some embodiments, any suitable pattern of gaps and electrodes may be used with fixed drive amplitude sense electrode 1006 to increase measurement resolution. Drive displacement 1008 corresponds to the distance covered by drive amplitude electrode 1004, along the first axis and in accordance with the received drive signal, to align with fixed drive amplitude sense electrode 1006. The drive amplitude electrode 1004 and fixed drive amplitude sense electrode 1006 extend along a second axis perpendicular to the first axis. It will be understood that drive displacement 1008 may be any suitable distance without driven mass 1002 making contact with a bump stop (not depicted).

Figure 11:
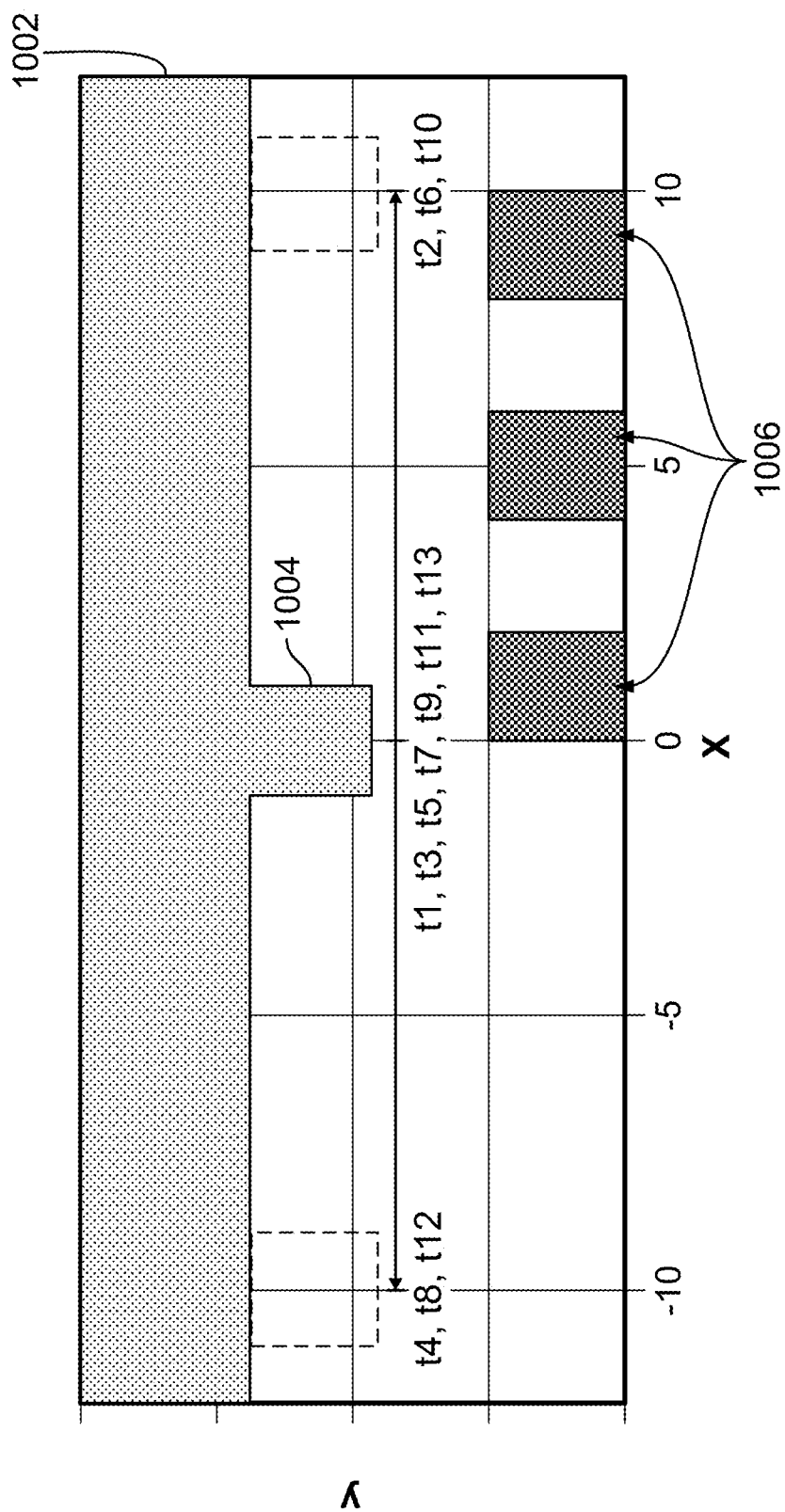
FIG. 11 shows an example diagram depicting a drive amplitude electrode capacitively engaging with multiple fixed drive amplitude sense electrodes over time in accordance with an embodiment of the present disclosure.

FIG. 11 shows an example diagram depicting a drive amplitude electrode capacitively engaging with multiple fixed drive amplitude sense electrodes over time in accordance with an embodiment of the present disclosure. FIG. 11 includes driven mass 1002, drive amplitude electrode 1004, and fixed drive amplitude sense electrodes 1006 of FIG. 10. Although FIG. 11 depicts drive amplitude electrode 1004 with a displacement of 10 units in either direction, it will be understood that drive amplitude electrode 1004 may be displaced any suitable distance, with respect to the origin, without driven mass 1002 making contact with a bump stop (not depicted). In some embodiments, any suitable number of timepoints may track the position of drive amplitude electrode 1004 while it oscillates, in accordance with the received drive signal, along the first axis. Drive amplitude electrode 1004 has a substantially similar width to fixed drive amplitude sense electrodes 1006, but it will be understood that drive amplitude electrode 1004 may have any suitable width with respect to fixed drive amplitude sense electrodes 1006. Drive amplitude electrode 1004, attached to driven mass 1002, moves in accordance with driven mass 1002 and corresponds to timepoints depicted in FIG. 11. The timepoints in FIG. 11 depict an exemplary oscillatory path of drive amplitude electrode 1004, which may follow any suitable path. Fixed drive amplitude sense electrodes 1006 are centered at approximately 1 unit, 5 units, and 9 units from the origin, and are approximately 2 units wide. It will be understood that fixed drive amplitude sense electrodes 1006 may be located at any suitable distance relative to the origin. Fixed drive amplitude sense electrodes 1006 capacitively engage with drive amplitude electrode 1004 based on drive amplitude electrode's 1004 oscillatory motion.

FIG. 12A shows an example diagram corresponding to FIG. 11 and depicting the drive amplitude electrode's displacement over time relative to an origin in accordance with an embodiment of the present disclosure. FIG. 12A depicts the oscillatory motion of the drive amplitude electrode, attached to the driven mass, with respect to the origin over time. The drive amplitude electrode displaces a maximum 10 units in either direction with respect to the origin over time, but it will be understood that the drive amplitude electrode may be displaced any suitable distance in response to the received drive signal.

FIG. 12B shows an example diagram corresponding to FIG. 11 and depicting the drive amplitude electrode's capacitive engagement with the fixed drive amplitude sense electrodes over time in accordance with an embodiment of the present disclosure. Capacitive spikes in FIG. 12B correspond with the drive amplitude electrode momentarily completely overlapping with one of the fixed drive amplitude sense electrodes' fixed positions at approximately 1 unit, 5 units, and 9 units, as depicted in FIG. 11, along the drive amplitude electrode's oscillatory motion. Minimum capacitance values correspond with gaps between fixed drive amplitude sense electrodes (e.g., at 3 units, 7 units, and 11 units). The diagram depicted in FIG. 12B corresponds with the timepoints depicted in FIG. 11. For example, three peaks and two valleys occur in between timepoints t1 and t2 and in between timepoints t2 and t3 before no capacitance is recorded at timepoint t4 due to the drive amplitude electrode being farthest away from the fixed drive amplitude sense electrodes within its oscillatory motion. Three more peaks and two more valleys are visible in between timepoints t5 and t6 and in between timepoints t6 and t7 before no capacitance is recorded at timepoint t8. Three peaks and two valleys are again measured in between timepoints t9 and t10 and in between timepoints t10 and t11 before failing to record a capacitance at timepoint t12. It will be understood that the path of the drive amplitude electrode may be tracked for any suitable amount of time with any suitable amount of timepoints.

FIG. 12C shows an example diagram corresponding to FIG. 11 and depicting the drive amplitude electrode's capacitive engagement with the fixed drive amplitude sense electrodes over the drive amplitude electrode's displacement in accordance with an embodiment of the present disclosure. A maximum capacitance 1202 is recorded by the MEMS gyroscope at approximately 1 unit, 5 units, and 9 units (e.g., the locations of fixed drive amplitude sense electrodes 1006 in FIG. 11) due to the drive amplitude electrode momentarily aligning with the fixed drive amplitude sense electrodes. A minimum change in capacitance 1204 is recorded by the MEMS gyroscope at approximately 3 units, 7 units, and 11 units (e.g., the locations of gaps in between fixed drive amplitude sense electrodes 1006 of FIG. 11) due to the drive amplitude electrode having minimal capacitive engagement with the gaps in between the fixed drive amplitude sense electrodes. In some embodiments, the position of the driven mass may be measured with a resolution of approximately 2 units by counting the peaks (e.g., the positions where the drive amplitude electrode aligns with the fixed drive amplitude sense electrodes to generate a maximum capacitance).

Figure 13:
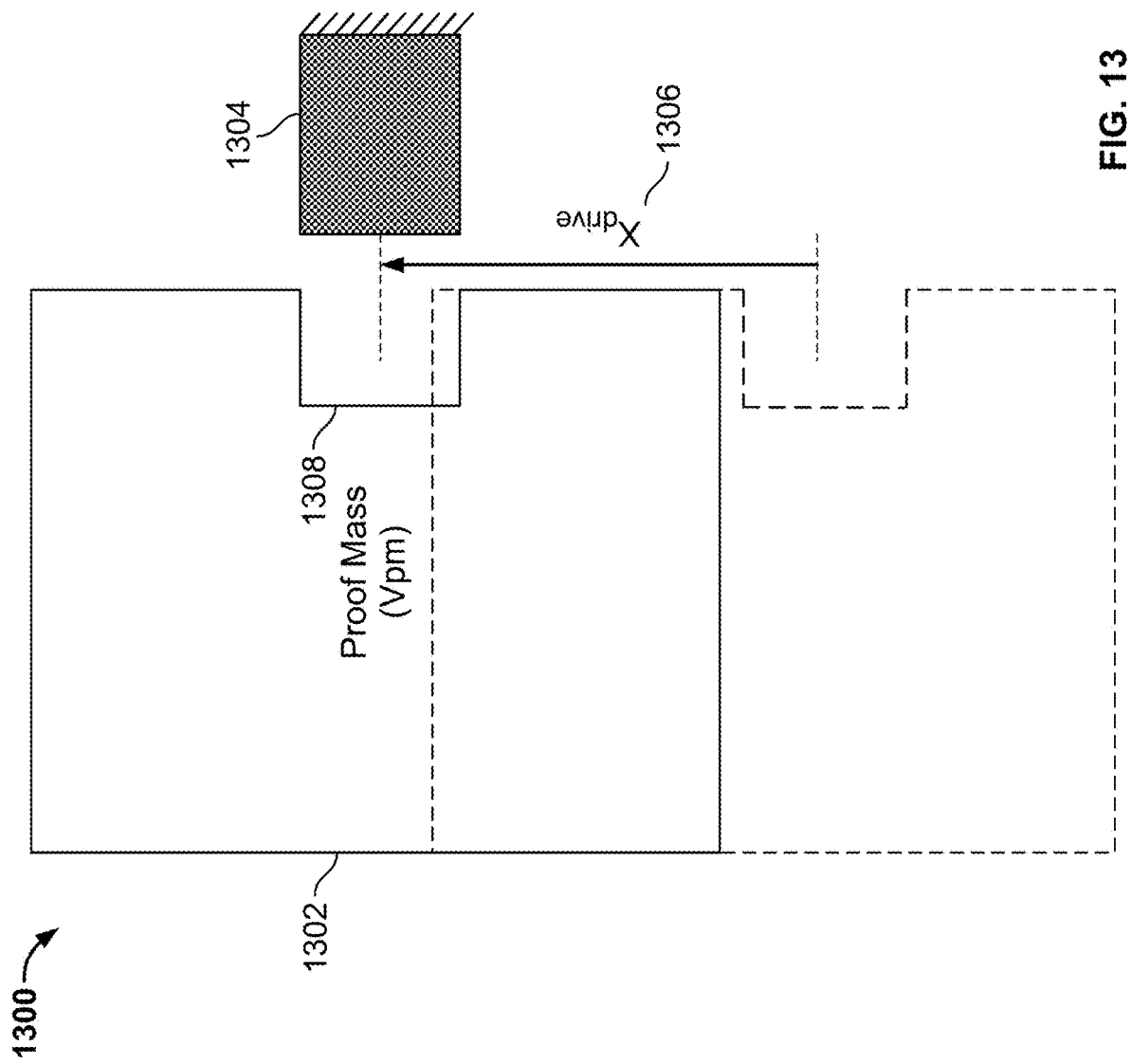
FIG. 13 shows an illustrative MEMS gyroscope with a drive amplitude electrode notch extending into a face of a driven mass in accordance with an embodiment of the present disclosure.

FIG. 13 shows an illustrative MEMS gyroscope with a drive amplitude electrode notch extending into a face of a driven mass in accordance with an embodiment of the present disclosure. FIG. 13 includes driven mass 1302 (e.g., corresponding to a drive sense electrode), fixed drive amplitude sense electrode 1304, drive amplitude electrode 1308, drive displacement 1306, and one or more fixed drive sense electrodes (not depicted). Drive amplitude electrode 1308 extends as a notch into a face of the driven mass 1302 and measures a minimum capacitance when aligned with fixed drive amplitude sense electrode 1304. In some embodiments, any suitable number of drive amplitude electrodes 1308 may extend into the face of the driven mass 1302. Drive displacement 1306 corresponds to the distance covered by drive amplitude electrode 1308, along the first axis and in accordance with a received drive signal, to align with fixed drive amplitude sense electrode 1304. It will be understood that drive displacement 1306 may be any suitable distance without driven mass 1302 making contact with a bump stop (not depicted).

Figure 14:
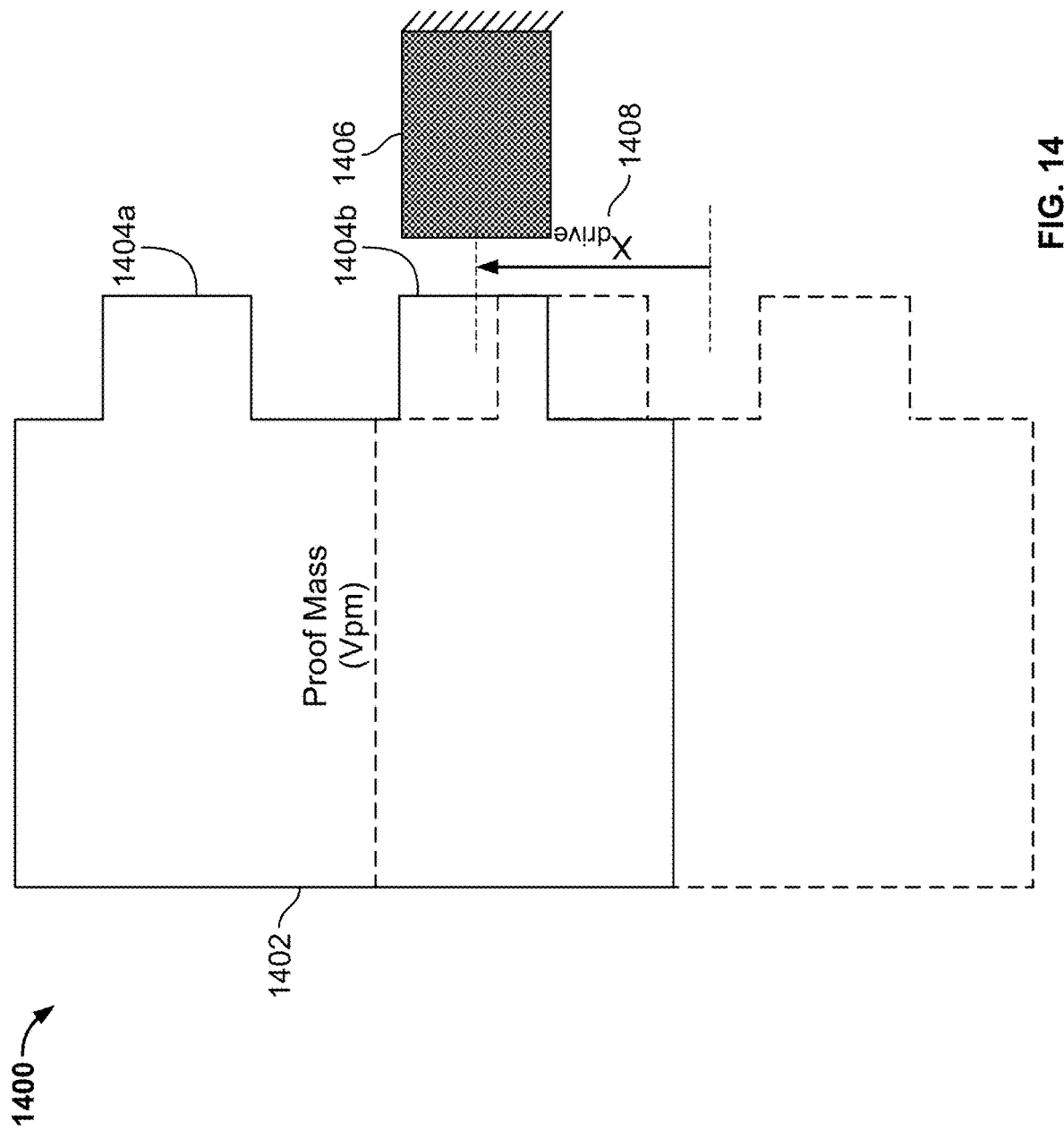
FIG. 14 shows an illustrative driven mass of a MEMS gyroscope with multiple drive amplitude electrodes in accordance with an embodiment of the present disclosure.

FIG. 14 shows an illustrative driven mass of a MEMS gyroscope with multiple drive amplitude electrodes in accordance with an embodiment of the present disclosure. FIG. 14 includes driven mass 1402 (e.g., corresponding to a drive sense electrode), drive amplitude electrodes 1404*a*, 1404*b*, fixed drive amplitude sense electrode 1406, drive displacement 1408, and one or more fixed drive sense electrodes (not depicted). In some embodiments, there may be any suitable number of drive amplitude electrodes 1404*a*, 1404*b* (e.g., notches) extending from driven mass 1402. In some embodiments, drive amplitude electrodes 1404*a*, 1404*b* may be used to cancel the effect of capacitance fringing fields. It will be understood that drive amplitude electrodes 1404*a*, 1404*b* may be used to detect intermediate positions of driven mass 1402 and, consequently, intermediate amplitude levels. Drive displacement 1408 corresponds to the distance covered by drive amplitude electrodes 1404*a*, 1404*b*, along the first axis and in accordance with a received drive signal, to align with fixed drive amplitude sense electrode 1406. It will be understood that drive displacement 1408 may be any suitable distance without driven mass 1402 making contact with a bump stop (not depicted).

Figure 15:
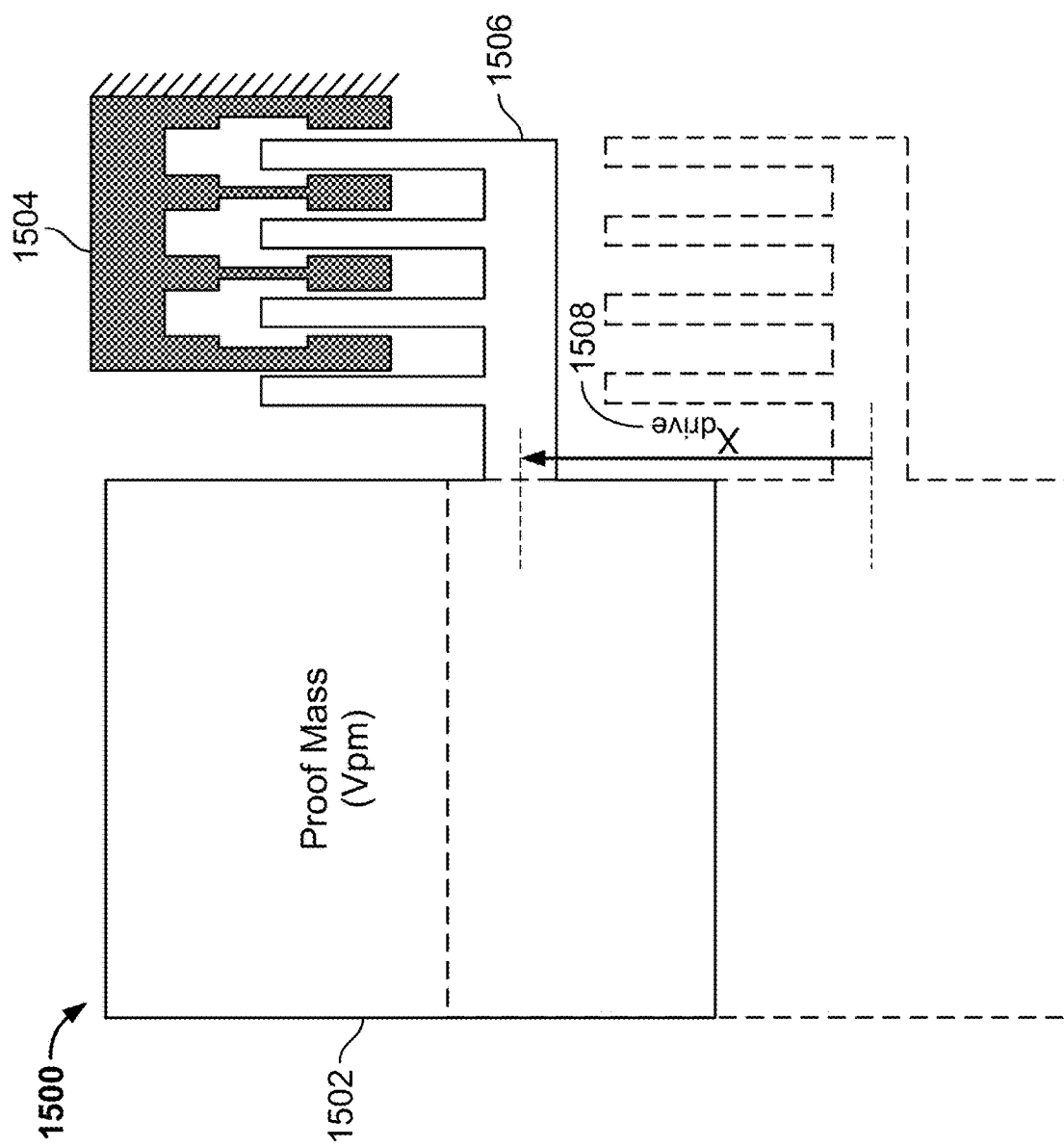
FIG. 15 shows an illustrative driven mass of a MEMS gyroscope with comb structure electrodes in accordance with an embodiment of the present disclosure.

FIG. 15 shows an illustrative driven mass of a MEMS gyroscope with comb structure electrodes in accordance with an embodiment of the present disclosure. FIG. 15 includes driven mass 1502 (e.g., corresponding to a drive sense electrode), drive amplitude comb sense electrode 1504, drive amplitude comb electrode 1506, drive displacement 1508, and one or more fixed drive sense electrodes (not depicted). Drive amplitude comb sense electrode 1504 and drive amplitude comb electrode 1506 allow for an extraction of information about comb structure gaps that is difficult to estimate and can be used for trimming the capacitive gains of MEMS gyroscope electrodes. The comb structure embodiment depicted in FIG. 15 implements the same principles (e.g., the detection of intermediate positions and intermediate amplitude levels, the compensation for a fringing field effect, and symmetry in the geometry of the electrodes), as depicted in FIG. 10. Drive displacement 1508 corresponds to the distance covered by drive amplitude comb electrode 1506, along the first axis and in accordance with a received drive signal, to align with drive amplitude comb sense electrode 1504. It will be understood that drive displacement 1508 may be any suitable distance without driven mass 1502 making contact with a bump stop (not depicted).

Figure 16:
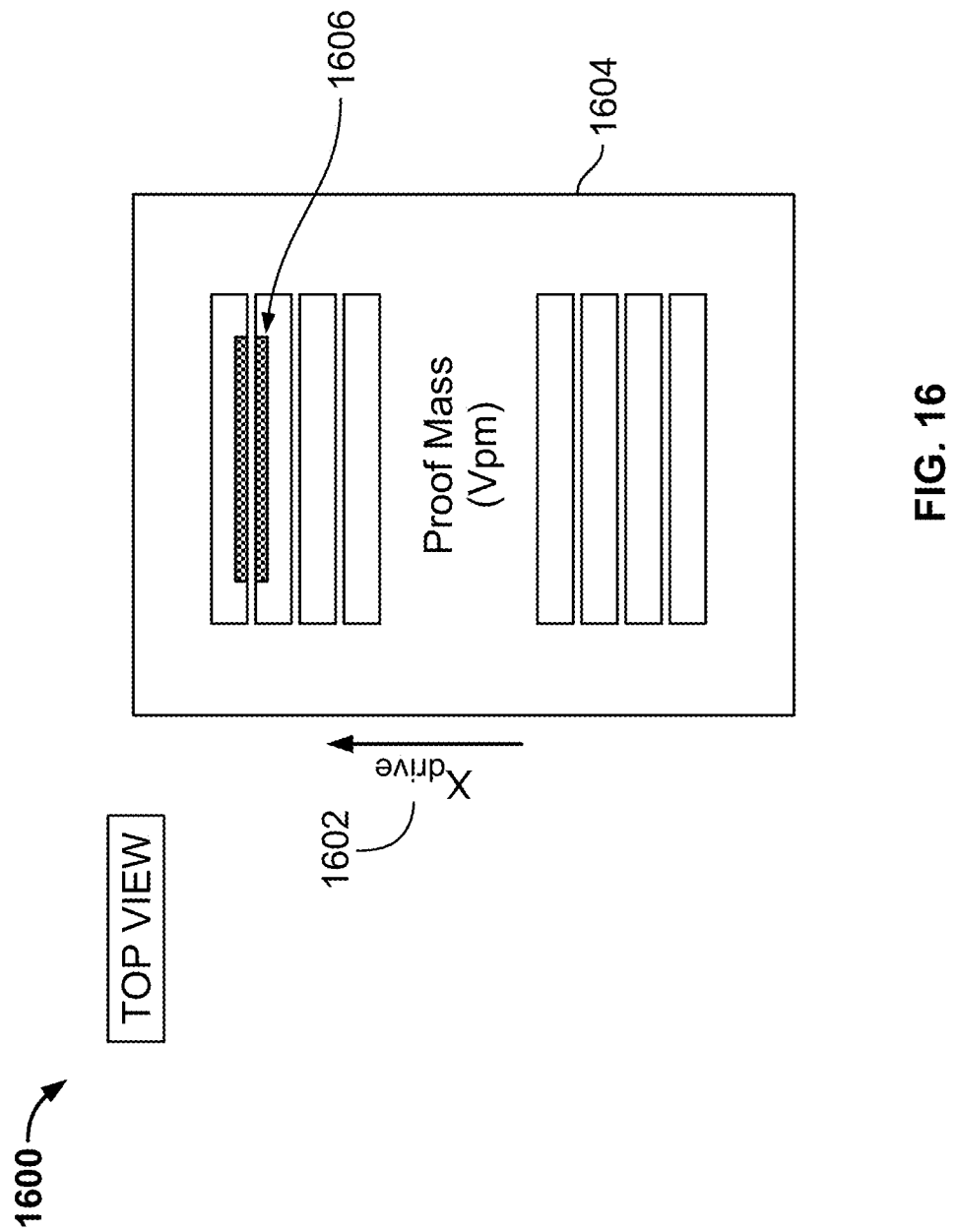
FIG. 16 shows a top view of an illustrative driven mass of a MEMS gyroscope with out-of-plane electrodes in accordance with an embodiment of the present disclosure.

FIG. 16 shows a top view of an illustrative driven mass of a MEMS gyroscope with out-of-plane electrodes in accordance with an embodiment of the present disclosure. FIG. 16 includes driven mass 1604 (e.g., corresponding to a drive sense electrode), out-of-plane fixed drive amplitude sense electrodes 1606, drive displacement 1602, and one or more fixed drive sense electrodes (not depicted). In some embodiments, multiple through-holes of the driven mass 1604 may be used with out-of-plane fixed drive amplitude sense electrodes 1606 to measure an oscillation amplitude, in a similar manner to the in-plane sensing embodiments described herein. In some embodiments, any discontinuity in the driven mass 1604 thickness may generate capacitance variation between out-of-plane fixed drive amplitude sense electrodes 1606. Drive displacement 1602 corresponds to the distance covered by driven mass 1604, along the first axis, in accordance with a received drive signal. It will be understood that drive displacement 1602 may be any suitable distance without driven mass 1604 making contact with a bump stop (not depicted).

Figure 17:
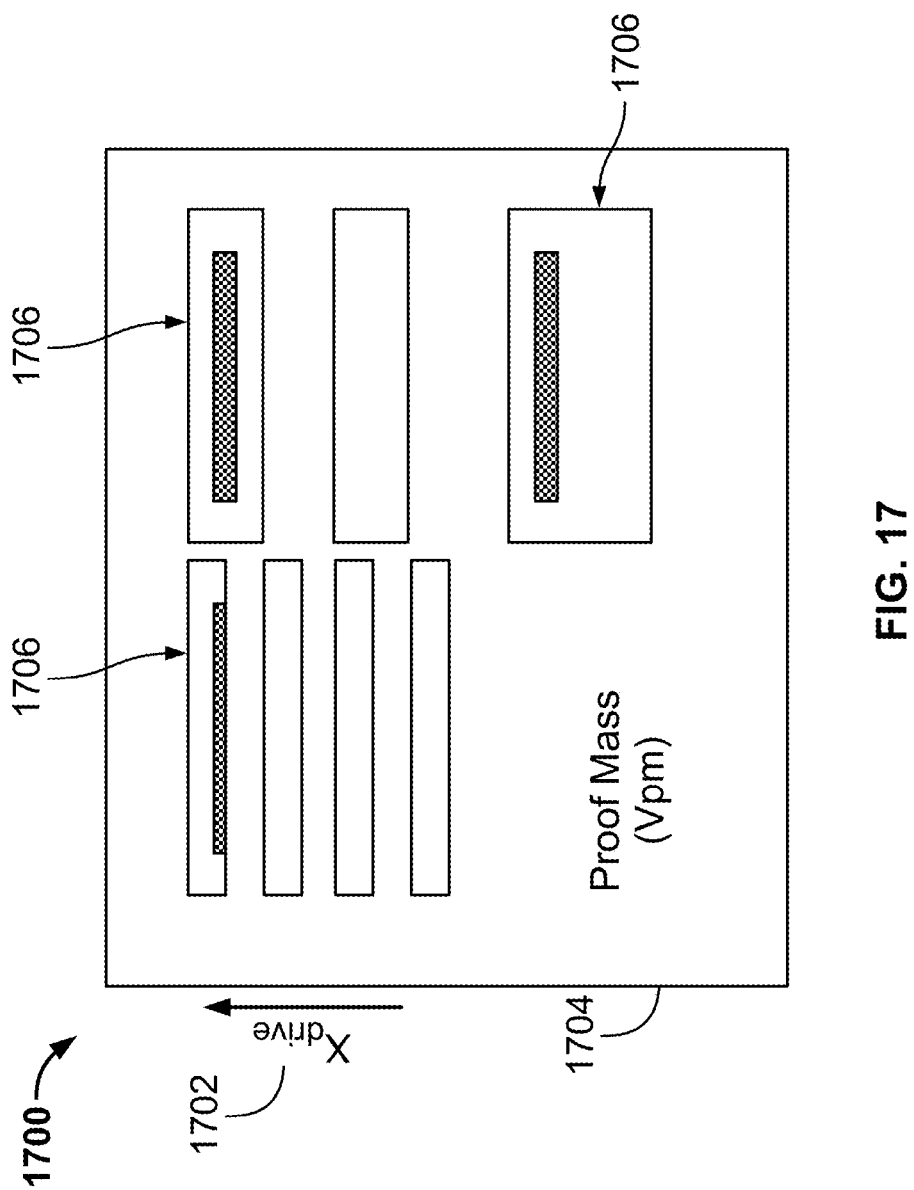
FIG. 17 shows an illustrative driven mass of a MEMS gyroscope with gray code out-of-plane electrodes in accordance with an embodiment of the present disclosure.

FIG. 17 shows an illustrative driven mass of a MEMS gyroscope with gray code out-of-plane electrodes in accordance with an embodiment of the present disclosure. FIG. 17 includes driven mass 1704 (e.g., corresponding to a drive sense electrode), gray code out-of-plane fixed drive amplitude sense electrodes 1706, drive displacement 1702, and one or more fixed drive sense electrodes (not depicted). Gray code out-of-plane fixed drive amplitude sense electrodes 1706 allow for absolute measurement of the position of driven mass 1704 by means of a series of electrodes. In some embodiments, gray code out-of-plane fixed drive amplitude sense electrodes 1706 may determine an absolute position of the MEMS with respect to an underlying substrate (e.g., a CMOS substrate). In some embodiments, gray code out-of-plane fixed drive amplitude sense electrodes 1706 may determine an absolute position of driven mass 1704 during oscillation, based on the gray code out-of-plane fixed drive amplitude sense electrodes 1706 and the holes in the driven mass 1702 having different respective sizes that respond to proportionally different movements. Gray code out-of-plane fixed drive amplitude sense electrodes 1706 work in a case of misalignment of the MEMS and substrate and can provide information on the misalignment. It will be understood that resolution with gray out-of-plane fixed drive amplitude sense electrodes 1706 depends on a number and sizing of electrodes (e.g., $2^n$, where n is the number of electrodes). In some embodiments, gray code out-of-plane fixed drive amplitude sense electrodes 1706 may require multiple electrodes and more surface area to implement. Drive displacement 1702 corresponds to the distance covered by driven mass 1704, along the first axis, in accordance with a received drive signal. It will be understood that drive displacement 1702 may be any suitable distance without driven mass 1704 making contact with a bump stop (not depicted).

As described herein, a measured capacitance of drive amplitude electrodes can be used to accurately determine a position of the driven mass with respect to a known fixed location within a sensor such as a MEMS gyroscope. This information may be used in a variety of manners. In some embodiments, the location information may be correlated to other known values, such as a measured value for a drive sense electrode. In this manner, it is known which measured drive sense electrode values correspond to specific distances, which in turn can be used to accurately scale drive sense values during sensor operation. In a similar manner, drive signal amplitude values may be associated with specific distances, so as to more accurately generate drive signals to result in particular drive movements, with or without the assistance of drive sense values. In some embodiments, the drive amplitude sense electrodes may themselves be used to directly control the drive motion of the sensor, for example, based on feedback indicating that a particular physical position (or subset of physical positions, with multiple drive amplitude sense electrodes) have been met by the driven mass.

Figure 18:
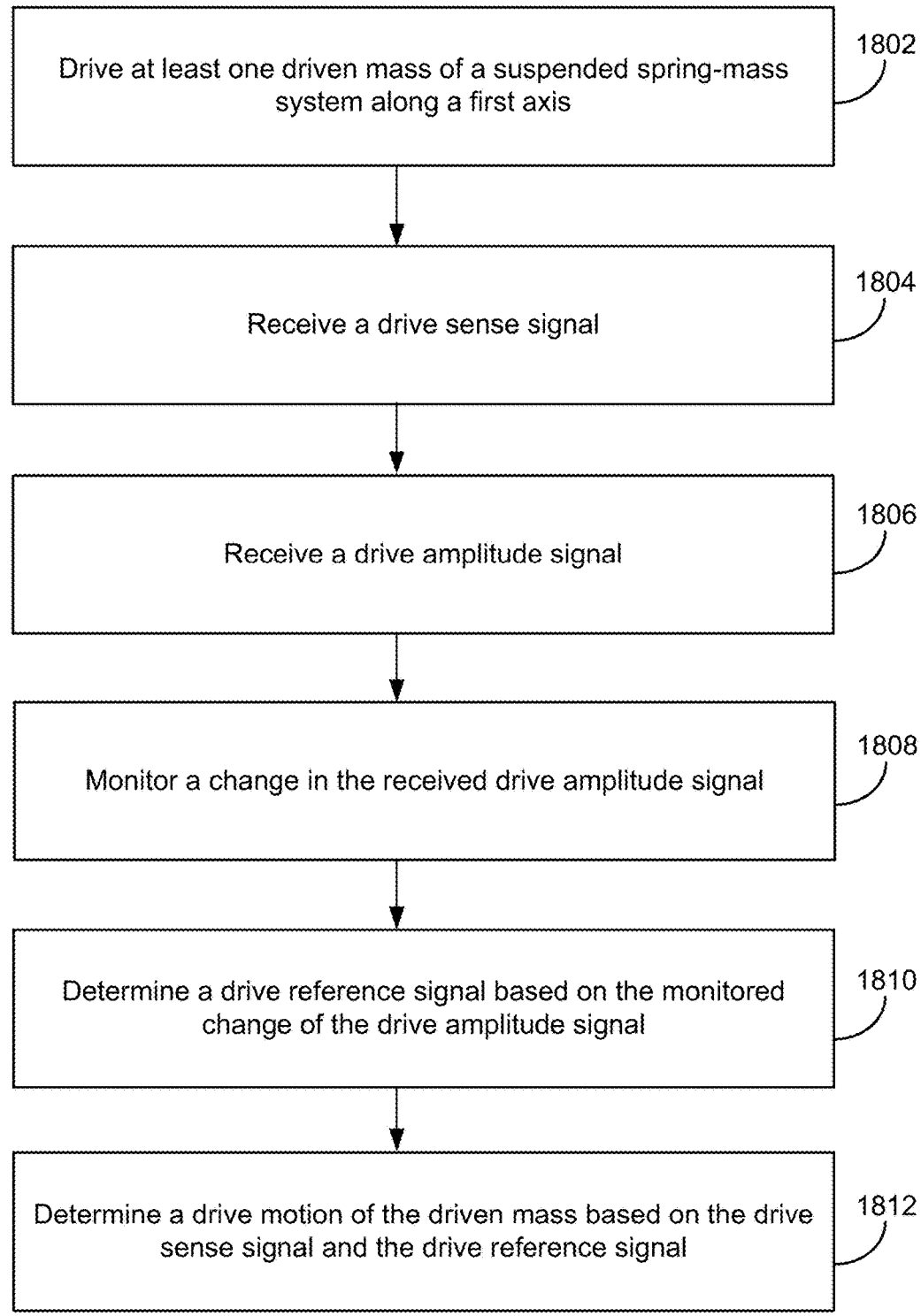
FIG. 18 shows illustrative steps of a method for operating a microelectromechanical system (MEMS) gyroscope in accordance with an embodiment of the present disclosure.

FIG. 18 shows illustrative steps of a method for operating a microelectromechanical system (MEMS) gyroscope in accordance with an embodiment of the present disclosure. Although a particular set of steps is depicted in a particular sequence in FIG. 18, it will be understood that one or more steps may be added or omitted and that the sequence of steps may be modified. Although the steps of FIG. 18 may be described within the context of driven mass 302, drive amplitude electrode 304, driven mass sense electrode, and fixed drive amplitude sense electrode 306 depicted and described in FIGS. 1-17 herein, it will be understood that the present steps may apply to other types of MEMS gyroscopes (e.g., with out-of-plane electrodes). It will further be understood that the steps described with respect to FIG. 18 may be performed for other signals and that the particular embodiment of FIG. 18 (e.g., related to processing of a MEMS sensor outputs) is provided for illustration only.

At step 1802, the MEMS gyroscope drives at least one driven mass of a suspended spring-mass system along a first axis. The driven mass includes at least one driven mass sense electrode responsive to the driving of the driven mass along a first axis and a drive amplitude electrode extending along a second axis that is perpendicular to the first axis. The drive amplitude electrode moves according to the oscillatory motion of the driven mass along the first axis. In some embodiments, the drive amplitude electrode may have other shapes or configurations, such as polygons, semicircles, etc., for example, to generate desirable signals for ease of processing. In some embodiments, the drive amplitude electrode may be any suitable size and the driven mass may include any suitable number of drive amplitude electrodes to cancel the effect of capacitance fringing fields. In some embodiments, the drive amplitude electrode may extend into a face of the driven mass and measure a minimum capacitance when aligned with the fixed drive amplitude sense electrode. The driven mass, in some embodiments, may include drive amplitude comb electrodes to detect intermediate positions of the driven mass (and consequently intermediate amplitude levels) and to compensate for a fringing field effect that may occur in some instances. Symmetry in the geometry of the comb electrodes results in compensation of the contribution of fringing field effects from each electrode.

At step 1804, the MEMS gyroscope receives a drive sense signal. The drive sense signal is based on a capacitive engagement of the at least one driven mass sense electrode with a fixed, adjacent driven mass sense electrode during the driving of the driven mass along the first axis. It will be understood that there may be any suitable number of driven mass sense electrodes coupled to the driven mass at any suitable location on the driven mass. Accordingly, in some embodiments, there may be any suitable number of corresponding fixed driven mass sense electrodes adjacent to the number of driven mass sense electrodes.

At step 1806, the MEMS gyroscope receives a drive amplitude signal. The drive amplitude electrode is based on an overlap of the drive amplitude electrode and the fixed drive amplitude sense electrode during the driving of the driven mass along the first axis. The sensed capacitance between the drive amplitude electrode and the fixed drive amplitude sense electrode changes solely based on the overlap between the drive amplitude electrode and the fixed drive amplitude sense electrode, including a maximum capacitance at any portions of the movement of the drive amplitude electrode at which there is complete overlap. It will be understood that the drive amplitude electrode may be configured to have either maximum or minimum capacitance variation in correspondence to target displacement. In some embodiments, the fixed drive amplitude sense electrode may have other shapes and configurations, such as polygons, semicircles, etc., for example, to generate desirable signals for ease of processing. It will be understood that the driven mass may include any suitable number of fixed drive amplitude sense electrodes in the MEMS layer of the gyroscope. In some embodiments, the fixed drive amplitude sense electrode is placed in a desired location during layout design of the MEMS gyroscope, such that the relative location of the drive amplitude electrode to the fixed drive amplitude sense electrode when the driven mass is at rest is known with a relatively high degree of certainty. It will be understood that the fixed drive amplitude sense electrode may include a comb structure to allow for an extraction of information about comb structure gaps that is difficult to estimate and can be used for trimming the capacitive gains of MEMS gyroscope electrodes. In some embodiments, the driven mass may include out-of-plane electrodes (e.g., gray code out-of-plane electrodes) that allow for absolute measurement of the position of the driven mass by means of a series of electrodes. It will be understood that gray code out-of-plane fixed drive amplitude sense electrodes may determine an absolute position of the MEMS with respect to an underlying substrate (e.g., a CMOS substrate).

At step 1808, the MEMS gyroscope monitors a change in the received drive amplitude signal. For example, the driven mass's oscillatory motion, with respect to the fixed drive amplitude sense electrode, may generate a varied capacitance between the drive amplitude electrode and the fixed drive amplitude sense electrode, which would alter the received drive amplitude signal. At step 1810, based on the monitored change of the drive amplitude signal, the MEMS gyroscope determines a drive reference signal. Lastly, at step 1812, the MEMS gyroscope determines a drive motion of the driven mass based on the drive sense signal and the drive reference signal.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical system (MEMS) gyroscope, comprising:
   a suspended spring-mass system located in a MEMS layer, wherein the suspended spring-mass system comprises a driven mass, and wherein the driven mass comprises:
      at least one driven mass sense electrode responsive to a movement of the driven mass along a first axis; and
      a drive amplitude electrode extending along a second axis that is perpendicular to the first axis;
   at least one fixed drive sense electrode located in the MEMS layer adjacent to the at least one driven mass sense electrode and configured to capacitively engage with the driven mass sense electrode based on the movement of the driven mass along the first axis to generate a drive sense signal;
   a fixed drive amplitude sense electrode located in the MEMS layer adjacent to the driven mass and configured to capacitively engage with the drive amplitude electrode based on the movement of the driven mass along the first axis; and
   processing circuitry configured to receive a drive amplitude signal based on an overlap of the drive amplitude electrode and the fixed drive amplitude sense electrode, monitor a change in the received drive amplitude signal, determine a drive reference signal based on the monitored change of the received drive amplitude signal, and determine a drive motion of the driven mass based on the drive sense signal and the drive reference signal.

2. The MEMS gyroscope of claim 1, wherein at least a portion of the processing circuitry is external to the MEMS gyroscope.

3. The MEMS gyroscope of claim 1, wherein the overlap of the drive amplitude electrode and the fixed drive amplitude sense electrode occurs during an initial trim of the MEMS gyroscope.

4. The MEMS gyroscope of claim 1, wherein the overlap of the drive amplitude electrode and the fixed drive amplitude sense electrode occurs periodically during an operation of the MEMS gyroscope.

5. The MEMS gyroscope of claim 1, wherein the drive amplitude electrode is a tab extending from a face of the driven mass.

6. The MEMS gyroscope of claim 5, wherein a width of the tab along the first axis is greater than a width of the fixed drive amplitude sense electrode along the first axis.

7. The MEMS gyroscope of claim 5, wherein a width of the tab along the first axis is substantially similar to a width of the fixed drive amplitude sense electrode along the first axis.

8. The MEMS gyroscope of claim 5, wherein a width of the tab along the first axis is less than a width of the fixed drive amplitude sense electrode along the first axis.

9. The MEMS gyroscope of claim 1, wherein the drive amplitude electrode is a notch extending into a face of the driven mass.

10. The MEMS gyroscope of claim 1, wherein the drive amplitude electrode comprises a first drive amplitude electrode, wherein the driven mass further comprises a second drive amplitude electrode, and wherein the second drive amplitude electrode capacitively engages with the fixed drive amplitude sense electrode based on the movement of the driven mass along the first axis.

11. The MEMS gyroscope of claim 1, wherein the fixed drive amplitude sense electrode comprises a first fixed drive amplitude sense electrode, further comprising a second fixed drive amplitude sense electrode, and wherein the drive amplitude electrode capacitively engages with the second fixed drive amplitude sense electrode based on the movement of the driven mass along the first axis.

12. The MEMS gyroscope of claim 1, wherein the drive amplitude electrode and the fixed drive amplitude sense electrode respectively comprise comb structures.

13. A microelectromechanical system (MEMS) gyroscope, comprising:
a suspended spring-mass system located in a MEMS layer, wherein the suspended spring-mass system comprises a first driven mass and a second driven mass, wherein the first driven mass comprises at least one first driven mass sense electrode responsive to a movement of the first driven mass in a first direction and a first drive amplitude electrode facing in a second direction that is perpendicular to the first direction, and wherein the second driven mass comprises at least one second driven mass sense electrode responsive to a movement of the second driven mass in the first direction and a second drive amplitude electrode facing in the second direction;
at least one first fixed drive sense electrode located in the MEMS layer adjacent to the at least one first driven mass sense electrode and configured to capacitively engage with the first driven mass sense electrode based on the movement of the first driven mass in the first direction to generate a first drive sense signal;
at least one second fixed drive sense electrode located in the MEMS layer adjacent to the at least one second driven mass sense electrode and configured to capacitively engage with the second driven mass sense electrode based on the movement of the second driven mass in the first direction to generate a second drive sense signal;
a first fixed drive amplitude sense electrode located in the MEMS layer adjacent to the first driven mass and configured to capacitively engage with the first drive amplitude electrode based on the movement of the first driven mass in the first direction;
a second fixed drive amplitude sense electrode located in the MEMS layer adjacent to the second driven mass and configured to capacitively engage with the second drive amplitude electrode based on the movement of the second driven mass in the first direction;
processing circuitry configured to receive a first drive amplitude signal based on a first overlap of the first drive amplitude electrode and the first fixed drive amplitude sense electrode, monitor a change in the received first drive amplitude signal, determine a first drive reference signal based on the monitored change of the received first drive amplitude signal, and determine a first drive motion of the first driven mass based on the first drive sense signal and the first drive reference signal, and wherein the processing circuitry is further configured to receive a second drive amplitude signal based on a second overlap of the received second drive amplitude electrode and the second fixed drive amplitude sense electrode, monitor a change in the received second drive amplitude signal, determine a second drive reference signal based on the monitored change of the second drive amplitude signal, and determine a second drive motion of the second driven mass based on the second drive sense signal and the second drive reference signal.

14. The MEMS gyroscope of claim 13, wherein the second overlap of the second drive amplitude electrode and the second fixed drive amplitude sense electrode occurs during the initial trim of the MEMS gyroscope.

15. The MEMS gyroscope of claim 13, wherein the second overlap of the second drive amplitude electrode and the second fixed drive amplitude sense electrode occurs periodically during an operation of the MEMS gyroscope.

16. The MEMS gyroscope of claim 13, wherein the second drive amplitude electrode is a tab extending from a face of the second driven mass.

17. The MEMS gyroscope of claim 16, wherein a width of the tab in the first direction is greater than a width of the second fixed drive amplitude sense electrode in the first direction.

18. The MEMS gyroscope of claim 16, wherein a width of the tab in the first direction is substantially similar to a width of the second fixed drive amplitude sense electrode in the first direction.

19. The MEMS gyroscope of claim 16, wherein a width of the tab in the first direction is less than a width of the second fixed drive amplitude sense electrode in the first direction.

20. The MEMS gyroscope of claim 13, wherein the second drive amplitude electrode is a notch extending into a face of the second driven mass.

21. A method for operating a microelectromechanical system (MEMS) gyroscope, comprising:
driving at least one driven mass of a suspended spring-mass system along a first axis, wherein the driven mass comprises at least one driven mass sense electrode responsive to the driving of the driven mass along the first axis and a drive amplitude electrode extending along a second axis that is perpendicular to the first axis;
receiving a drive sense signal, wherein the drive sense signal is based on a capacitive engagement of the at least one driven mass sense electrode with a fixed driven mass sense electrode during the driving of the driven mass along the first axis;
receiving a drive amplitude signal, wherein the drive amplitude signal is based on an overlap of the drive amplitude electrode and a fixed drive amplitude sense electrode during the driving of the driven mass along the first axis;

monitoring a change in the received drive amplitude signal;

determining a drive reference signal based on the monitored change of the received drive amplitude signal; and determining a drive motion of the driven mass based on the drive sense signal and the drive reference signal.

* * * * *